(12) United States Patent
Gorobets et al.

(10) Patent No.: US 7,340,581 B2
(45) Date of Patent: Mar. 4, 2008

(54) METHOD OF WRITING DATA TO NON-VOLATILE MEMORY

(75) Inventors: Sergey Anatolievich Gorobets, Edinburgh (GB); Alan David Bennett, Edinburgh (GB); Alan Welsh Sinclair, Edinburgh (GB)

(73) Assignee: Lexar Media, Inc., Fremont, CA (US)

( * ) Notice: Subject to any disclaimer, the term of this patent is extended or adjusted under 35 U.S.C. 154(b) by 593 days.

(21) Appl. No.: 10/260,259

(22) Filed: Sep. 27, 2002

(65) Prior Publication Data

US 2003/0165076 A1    Sep. 4, 2003

(30) Foreign Application Priority Data

Sep. 28, 2001    (GB) ................................. 0123415.2

(51) Int. Cl.
*G06F 12/02* (2006.01)
*G11C 16/00* (2006.01)

(52) U.S. Cl. ................... 711/202; 711/103; 365/185.33

(58) Field of Classification Search ........... 365/185.33, 365/94, 218; 711/101–105, 4, 111, 154, 711/202–203

See application file for complete search history.

(56) References Cited

U.S. PATENT DOCUMENTS

| | | | |
|---|---|---|---|
| 4,099,069 A | 7/1978 | Cricchi et al. | |
| 4,130,900 A | 12/1978 | Watanabe | |
| 4,210,959 A | 7/1980 | Wozniak ..................... | 364/200 |
| 4,309,627 A | 1/1982 | Tabata | |
| 4,355,376 A | 10/1982 | Gould ......................... | 365/230 |
| 4,398,248 A | 8/1983 | Hsia et al. | |
| 4,405,952 A | 9/1983 | Slakmon ...................... | 360/49 |
| 4,414,627 A | 11/1983 | Nakamura | |
| 4,450,559 A | 5/1984 | Bond et al. .................... | 371/10 |
| 4,456,971 A | 6/1984 | Fukuda et al. .............. | 364/900 |
| 4,468,730 A | 8/1984 | Dodd et al. | |
| 4,473,878 A | 9/1984 | Zolnowsky et al. | |
| 4,476,526 A | 10/1984 | Dodd | |
| 4,498,146 A | 2/1985 | Martinez ..................... | 364/900 |
| 4,525,839 A | 6/1985 | Nozawa et al. ............... | 371/38 |
| 4,532,590 A | 7/1985 | Wallach et al. | |
| 4,609,833 A | 9/1986 | Guterman | |

(Continued)

FOREIGN PATENT DOCUMENTS

AU    0 557 723    1/1987

(Continued)

OTHER PUBLICATIONS

Magazine—Technology Updates, Integrated Circuits, "1-Mbit flash memories seek their role in system design", Ron Wilson, Senior Editor, Computer Design magazine 28 Mar. 1, 1989, No. 5, Tulsa OK. US, pp. 30 and 32.

(Continued)

*Primary Examiner*—Denise Tran
(74) *Attorney, Agent, or Firm*—Leffert, Jay & Polglaze P.A.

(57) ABSTRACT

According to a first aspect of the invention, there is provided a controller connected to a non-volatile memory and including a volatile memory, wherein the controller maintains lists in volatile memory of blocks in the non-volatile memory allocated for storage of logical sector data and of blocks recently erased in the non-volatile memory.

10 Claims, 14 Drawing Sheets

U.S. PATENT DOCUMENTS

| | | | | |
|---|---|---|---|---|
| 4,616,311 | A | 10/1986 | Sato | 364/200 |
| 4,654,847 | A | 3/1987 | Dutton | 371/10 |
| 4,710,871 | A | 12/1987 | Belknap et al. | 364/200 |
| 4,746,998 | A | 5/1988 | Robinson et al. | 360/72.1 |
| 4,748,320 | A | 5/1988 | Yorimoto et al. | 235/492 |
| 4,757,474 | A | 7/1988 | Fukushi et al. | 365/189 |
| 4,774,700 | A | 9/1988 | Satoh et al. | 369/54 |
| 4,780,855 | A | 10/1988 | Iida et al. | |
| 4,788,665 | A | 11/1988 | Fukuda et al. | |
| 4,797,543 | A | 1/1989 | Watanabe | |
| 4,800,520 | A | 1/1989 | Iijima | 364/900 |
| 4,829,169 | A | 5/1989 | Watanabe | |
| 4,843,224 | A | 6/1989 | Ohta et al. | |
| 4,896,262 | A | 1/1990 | Wayama et al. | 364/200 |
| 4,914,529 | A | 4/1990 | Bonke | 360/48 |
| 4,920,518 | A | 4/1990 | Nakamura et al. | 365/228 |
| 4,924,331 | A | 5/1990 | Robinson et al. | 360/72.1 |
| 4,943,745 | A | 7/1990 | Watanabe et al. | |
| 4,953,122 | A | 8/1990 | Williams | 364/900 |
| 4,970,642 | A | 11/1990 | Yamamura | |
| 4,970,727 | A | 11/1990 | Miyawaki et al. | |
| 5,070,474 | A | 12/1991 | Tuma et al. | 395/500 |
| 5,093,785 | A | 3/1992 | Iijima | |
| 5,168,465 | A | 12/1992 | Harari | 257/320 |
| 5,198,380 | A | 3/1993 | Harari | 437/43 |
| 5,200,959 | A | 4/1993 | Gross et al. | 371/21.6 |
| 5,218,695 | A | 6/1993 | Noveck et al. | |
| 5,220,518 | A | 6/1993 | Haq | |
| 5,226,168 | A | 7/1993 | Kobayashi et al. | 395/800 |
| 5,227,714 | A | 7/1993 | Lou | |
| 5,253,351 | A | 10/1993 | Yamamoto et al. | |
| 5,267,218 | A | 11/1993 | Elbert | |
| 5,268,318 | A | 12/1993 | Harari | 437/43 |
| 5,268,870 | A | 12/1993 | Harari | 365/218 |
| 5,270,979 | A | 12/1993 | Harari et al. | 365/218 |
| 5,293,560 | A | 3/1994 | Harari | 365/185 |
| 5,297,148 | A | 3/1994 | Harari et al. | 371/10.2 |
| 5,303,198 | A | 4/1994 | Adachi et al. | 365/218 |
| 5,305,276 | A | 4/1994 | Uenoyama | |
| 5,305,278 | A | 4/1994 | Inoue | |
| 5,315,541 | A | 5/1994 | Harari et al. | 365/63 |
| 5,315,558 | A | 5/1994 | Hag | |
| 5,329,491 | A | 7/1994 | Brown et al. | |
| 5,337,275 | A | 8/1994 | Garner | 365/189.01 |
| 5,341,330 | A | 8/1994 | Wells et al. | 365/185 |
| 5,341,339 | A | 8/1994 | Wells | |
| 5,341,341 | A | 8/1994 | Fukuzo et al. | |
| 5,353,256 | A | 10/1994 | Fandrich et al. | 365/230.03 |
| 5,357,475 | A | 10/1994 | Hasbun et al. | 365/218 |
| 5,359,569 | A | 10/1994 | Fujita et al. | |
| 5,365,127 | A | 11/1994 | Manley | |
| 5,369,615 | A | 11/1994 | Harari et al. | 365/218 |
| 5,371,702 | A | 12/1994 | Nakai et al. | |
| 5,381,539 | A | 1/1995 | Yanai et al. | |
| 5,382,839 | A | 1/1995 | Shinohara | |
| 5,384,743 | A | 1/1995 | Rouy | |
| 5,388,083 | A | 2/1995 | Assar et al. | 365/218 |
| 5,396,468 | A | 3/1995 | Harari et al. | 365/218 |
| 5,404,485 | A | 4/1995 | Ban | |
| 5,406,527 | A | 4/1995 | Honma | |
| 5,418,752 | A | 5/1995 | Harari et al. | 365/218 |
| 5,422,842 | A | 6/1995 | Cernea et al. | 365/185 |
| 5,422,856 | A | 6/1995 | Sasaki et al. | |
| 5,428,621 | A | 6/1995 | Mehrotra et al. | 371/21.4 |
| 5,430,682 | A | 7/1995 | Ishikawa et al. | |
| 5,430,859 | A | 7/1995 | Norman et al. | 395/425 |
| 5,431,330 | A | 7/1995 | Wieres | |
| 5,434,825 | A | 7/1995 | Harari | 365/185 |
| 5,438,573 | A | 8/1995 | Mangan et al. | 371/10.3 |
| 5,465,235 | A | 11/1995 | Miyamoto | |
| 5,465,338 | A | 11/1995 | Clay et al. | |
| 5,471,478 | A | 11/1995 | Mangan et al. | 371/10.3 |
| 5,473,765 | A | 12/1995 | Gibbons et al. | |
| 5,479,638 | A | 12/1995 | Assar et al. | 395/430 |
| 5,485,595 | A | 1/1996 | Assar et al. | 395/430 |
| 5,490,117 | A | 2/1996 | Oda et al. | |
| 5,495,442 | A | 2/1996 | Cernea et al. | 365/185.03 |
| 5,504,760 | A | 4/1996 | Harari et al. | 371/40.1 |
| 5,508,971 | A | 4/1996 | Cernea et al. | 365/185.23 |
| 5,513,138 | A | 4/1996 | Manabe et al. | |
| 5,515,333 | A | 5/1996 | Fujita et al. | |
| 5,519,847 | A | 5/1996 | Fandrich et al. | |
| 5,523,980 | A | 6/1996 | Sakui et al. | |
| 5,524,230 | A | 6/1996 | Sakaue et al. | 395/430 |
| 5,530,673 | A | 6/1996 | Tobita et al. | |
| 5,530,828 | A | 6/1996 | Kaki et al. | |
| 5,530,938 | A | 6/1996 | Akasaka et al. | |
| 5,532,962 | A | 7/1996 | Auclair et al. | 365/201 |
| 5,532,964 | A | 7/1996 | Cernea et al. | 365/189.09 |
| 5,534,456 | A | 7/1996 | Yuan et al. | 437/43 |
| 5,535,328 | A | 7/1996 | Harari et al. | 395/182.05 |
| 5,541,551 | A | 7/1996 | Brehner et al. | |
| 5,544,118 | A | 8/1996 | Harari | 365/218 |
| 5,544,356 | A | 8/1996 | Robinson et al. | 395/600 |
| 5,552,698 | A | 9/1996 | Tai et al. | |
| 5,554,553 | A | 9/1996 | Harari | 437/43 |
| 5,563,825 | A | 10/1996 | Cernea et al. | 365/185.18 |
| 5,566,314 | A | 10/1996 | DeMarco et al. | 395/430 |
| 5,568,439 | A | 10/1996 | Harari | 365/218 |
| 5,572,466 | A | 11/1996 | Sukegawa | |
| 5,579,502 | A | 11/1996 | Konishi et al. | |
| 5,581,723 | A | 12/1996 | Hasbun et al. | |
| 5,583,812 | A | 12/1996 | Harari | 365/185.33 |
| 5,592,415 | A | 1/1997 | Kato et al. | |
| 5,592,420 | A | 1/1997 | Cernea et al. | 365/185.18 |
| 5,596,526 | A | 1/1997 | Assar et al. | |
| 5,598,370 | A | 1/1997 | Niijima et al. | |
| 5,602,987 | A | 2/1997 | Harari et al. | |
| 5,603,001 | A | 2/1997 | Sukegawa et al. | |
| 5,606,660 | A | 2/1997 | Estakhri et al. | |
| 5,611,067 | A | 3/1997 | Okamoto et al. | |
| 5,640,528 | A | 6/1997 | Harney et al. | |
| 5,642,312 | A | 6/1997 | Harari | 365/185.33 |
| 5,648,929 | A | 7/1997 | Miyamoto | |
| 5,663,901 | A | 9/1997 | Wallace et al. | 365/52 |
| 5,693,570 | A | 12/1997 | Cernea et al. | 437/205 |
| 5,712,819 | A | 1/1998 | Harari | 365/185.29 |
| 5,719,808 | A | 2/1998 | Harari et al. | 365/185.33 |
| 5,723,990 | A | 3/1998 | Roohparvar | |
| 5,734,567 | A | 3/1998 | Griffiths et al. | |
| 5,745,418 | A | 4/1998 | Ma et al. | |
| 5,754,567 | A | 5/1998 | Norman | |
| 5,757,712 | A | 5/1998 | Nagel et al. | |
| 5,758,100 | A | 5/1998 | Odisho | |
| 5,761,117 | A | 6/1998 | Uchino et al. | |
| 5,768,190 | A | 6/1998 | Tanaka et al. | |
| 5,768,195 | A | 6/1998 | Nakamura et al. | |
| 5,773,901 | A | 6/1998 | Kantner | |
| 5,778,418 | A | 7/1998 | Auclair et al. | 711/101 |
| 5,781,478 | A | 7/1998 | Takeuchi et al. | |
| 5,787,445 | A | 7/1998 | Daberko | |
| 5,787,484 | A | 7/1998 | Norman | |
| RE35,881 | E | 8/1998 | Barrett et al. | |
| 5,799,168 | A | 8/1998 | Ban | |
| 5,802,551 | A | 9/1998 | Komatsu et al. | |
| 5,809,515 | A | 9/1998 | Kaki et al. | |
| 5,809,558 | A | 9/1998 | Matthews et al. | |
| 5,809,560 | A | 9/1998 | Schneider | |
| 5,818,350 | A | 10/1998 | Estakhri et al. | |
| 5,818,781 | A | 10/1998 | Estakhri et al. | |
| 5,822,245 | A | 10/1998 | Gupta et al. | |
| 5,822,252 | A | 10/1998 | Lee et al. | |
| 5,822,781 | A | 10/1998 | Wells et al. | |
| 5,831,929 | A | 11/1998 | Manning et al. | |

| | | | |
|---|---|---|---|
| 5,835,935 A | 11/1998 | Estakhri et al. | |
| 5,838,614 A | 11/1998 | Estakhri et al. | |
| 5,845,313 A | 12/1998 | Estakhri et al. | |
| 5,847,552 A | 12/1998 | Brown | |
| 5,860,083 A | 1/1999 | Sukegawa | |
| 5,860,124 A | 1/1999 | Matthews et al. | |
| 5,862,099 A | 1/1999 | Gannage et al. | |
| 5,890,192 A | 3/1999 | Lee et al. | |
| 5,901,086 A | 5/1999 | Wang et al. | |
| 5,907,856 A | 5/1999 | Estakhri et al. | |
| 5,909,586 A | 6/1999 | Anderson | |
| 5,920,884 A | 7/1999 | Jennings, III et al. | |
| 5,924,113 A | 7/1999 | Estakhri et al. | |
| 5,928,370 A | 7/1999 | Asnaashari et al. | |
| 5,930,815 A | 7/1999 | Estakhri et al. | |
| 5,933,368 A | 8/1999 | Ma et al. | |
| 5,933,846 A | 8/1999 | Endo | |
| 5,936,971 A | 8/1999 | Harari et al. | |
| 5,937,425 A | 8/1999 | Ban et al. | |
| 5,953,737 A | 9/1999 | Estakhri et al. | |
| 5,956,473 A | 9/1999 | Ma et al. | |
| 5,959,926 A | 9/1999 | Jones et al. | |
| 5,966,727 A | 10/1999 | Nishino et al. | |
| 5,986,933 A | 11/1999 | Takeuchi et al. | |
| 5,987,563 A | 11/1999 | Itoh et al. | |
| 5,987,573 A | 11/1999 | Hiraka et al. | |
| 5,991,849 A | 11/1999 | Yamada et al. | |
| 6,011,322 A | 1/2000 | Stumfall et al. | |
| 6,011,323 A | 1/2000 | Camp et al. | |
| 6,018,265 A | 1/2000 | Keshtbod | |
| 6,021,408 A | 2/2000 | Ledain et al. | |
| 6,026,020 A | 2/2000 | Matsubara et al. | |
| 6,026,027 A | 2/2000 | Terrell, II et al. | |
| 6,034,897 A | 3/2000 | Estakhri et al. | |
| 6,035,357 A | 3/2000 | Sakaki | |
| 6,040,997 A | 3/2000 | Estakhri et al. | |
| 6,041,001 A | 3/2000 | Estakhri | |
| 6,202,138 B1 | 3/2000 | Estakhri et al. | |
| 6,047,352 A | 4/2000 | Lakhani et al. | |
| 6,055,184 A | 4/2000 | Acharya et al. | |
| 6,055,188 A | 4/2000 | Takeuchi et al. | |
| 6,069,827 A | 5/2000 | Sinclair | |
| 6,072,796 A | 6/2000 | Christensen et al. | |
| 6,076,137 A | 6/2000 | Asnaashari | |
| 6,081,447 A | 6/2000 | Lofgren et al. | |
| 6,081,878 A | 6/2000 | Estakhri et al. | |
| 6,084,483 A | 7/2000 | Keshtbod | |
| 6,097,666 A | 8/2000 | Sakui et al. | |
| 6,115,785 A | 9/2000 | Estakhri et al. | |
| 6,122,195 A | 9/2000 | Estakhri et al. | |
| 6,125,424 A | 9/2000 | Komatsu et al. | |
| 6,125,435 A | 9/2000 | Estakhri et al. | |
| 6,128,695 A | 10/2000 | Estakhri et al. | |
| 6,134,145 A | 10/2000 | Wong | |
| 6,134,151 A | 10/2000 | Estakhri et al. | |
| 6,141,249 A | 10/2000 | Estakhri et al. | |
| 6,145,051 A | 11/2000 | Estakhri et al. | |
| 6,151,247 A | 11/2000 | Estakhri et al. | |
| 6,172,906 B1 | 1/2001 | Estakhri et al. | |
| 6,173,362 B1 | 1/2001 | Yoda | |
| 6,181,118 B1 | 1/2001 | Meehan et al. | |
| 6,182,162 B1 | 1/2001 | Estakhri et al. | |
| 6,223,308 B1 | 4/2001 | Estakhri et al. | |
| 6,226,708 B1 | 5/2001 | McGoldrick et al. | |
| 6,230,234 B1 | 5/2001 | Estakhri et al. | |
| 6,262,918 B1 | 7/2001 | Estakhri et al. | |
| 6,272,610 B1 | 8/2001 | Katayama et al. | |
| 6,275,436 B1 | 8/2001 | Tobita et al. | |
| 6,279,069 B1 | 8/2001 | Robinson et al. | |
| 6,279,114 B1 | 8/2001 | Toombs et al. | |
| 6,285,607 B1 | 9/2001 | Sinclair | |
| 6,327,639 B1 | 12/2001 | Asnaashari | |
| 6,345,367 B1 | 2/2002 | Sinclair | |
| 6,374,337 B1 | 4/2002 | Estakhri et al. | |
| 6,385,667 B1 | 5/2002 | Estakhri et al. | |
| 6,393,513 B2 | 5/2002 | Estakhri et al. | |
| 6,397,314 B1 | 5/2002 | Estakhri et al. | |
| 6,411,546 B1 | 6/2002 | Estakhri et al. | |
| 6,467,021 B1 | 10/2002 | Sinclair | |
| 6,490,649 B2 | 12/2002 | Sinclair | |
| 6,567,307 B1 | 5/2003 | Estakhri | |
| 6,578,127 B1 | 6/2003 | Sinclair | |
| 6,587,382 B1 | 7/2003 | Estakhri et al. | |
| 6,711,059 B2 | 3/2004 | Sinclair et al. | |
| 6,721,819 B2 | 4/2004 | Estakhri et al. | |
| 6,721,843 B1 | 4/2004 | Estakhri | |
| 6,728,851 B1 | 4/2004 | Estakhri et al. | |
| 6,751,155 B2 | 6/2004 | Gorobets | |
| 6,757,800 B1 | 6/2004 | Estakhri et al. | |
| 6,725,321 B1 * | 8/2004 | Sinclair et al. | 711/103 |
| 6,772,274 B1 | 8/2004 | Estakhri | |
| 6,813,678 B1 | 11/2004 | Sinclair et al. | |
| 6,898,662 B2 | 5/2005 | Gorobets | |
| 6,912,618 B2 | 6/2005 | Estakhri et al. | |
| 6,950,918 B1 | 9/2005 | Estakhri | |
| 6,957,295 B1 | 10/2005 | Estakhri | |
| 6,973,519 B1 | 12/2005 | Estakhri et al. | |
| 6,978,342 B1 | 12/2005 | Estakhri et al. | |
| 7,000,064 B2 | 2/2006 | Payne et al. | |
| 2003/0033471 A1 | 2/2003 | Lin et al. | |

FOREIGN PATENT DOCUMENTS

| | | |
|---|---|---|
| EP | 0 220 718 A2 | 5/1987 |
| EP | 0 243 503 A1 | 11/1987 |
| EP | 0 392 895 A2 | 10/1990 |
| EP | 0 424 191 A2 | 4/1991 |
| EP | 0 489 204 A1 | 6/1992 |
| EP | 0 522 780 A2 | 1/1993 |
| EP | 0 522 780 B1 | 1/1993 |
| EP | 0 544 252 A2 | 6/1993 |
| EP | 0 613 151 A2 | 8/1994 |
| EP | 0 617 363 A2 | 9/1994 |
| EP | 0 619 541 A2 | 10/1994 |
| EP | 0 663 636 A1 | 7/1995 |
| EP | 0 686 976 A2 | 12/1995 |
| EP | 0 834 882 A2 | 4/1998 |
| EP | 1 031 929 A2 | 8/2000 |
| EP | 1 286 267 A1 | 2/2003 |
| EP | 1 157 328 B1 | 5/2005 |
| FR | 93 01908 | 8/1993 |
| GB | 2 251 323 | 7/1992 |
| GB | 2 291 990 | 2/1996 |
| GB | 2 291 991 A | 7/1996 |
| GB | 2 297 637 A | 7/1996 |
| GB | 2 304 428 | 3/1997 |
| IS | 117881 | 5/2003 |
| JP | 3-228377 | 10/1981 |
| JP | 62-283496 A | 12/1987 |
| JP | 62-283496 A | 12/1987 |
| JP | 62-283497 A | 12/1987 |
| JP | 62-283497 A | 12/1987 |
| JP | 1-138694 | 5/1989 |
| JP | 4-57295 | 2/1992 |
| JP | 4-254994 | 9/1992 |
| JP | 4-268284 | 9/1992 |
| JP | 4-278297 | 10/1992 |
| JP | 5-128877 | 5/1993 |
| JP | 5-282883 | 10/1993 |
| JP | 6-4399 | 1/1994 |
| JP | 6-36578 | 2/1994 |
| JP | 6-124175 | 5/1994 |
| JP | 6-124231 | 5/1994 |
| JP | 6-131889 | 5/1994 |
| JP | 6-132747 | 5/1994 |
| JP | 6-149395 | 5/1994 |

| | | |
|---|---|---|
| JP | 6-266596 | 9/1994 |
| JP | 7-93499 | 4/1995 |
| JP | 7-114499 | 5/1995 |
| JP | 7-311708 | 11/1995 |
| JP | 8-18018 | 1/1996 |
| JP | 8-69696 | 3/1996 |
| JP | 9-147581 | 6/1997 |
| SU | 1388877 A1 | 4/1988 |
| SU | 1408439 A1 | 7/1988 |
| SU | 1515164 A1 | 10/1989 |
| SU | 1541619 A1 | 2/1990 |
| SU | 1573458 A2 | 6/1990 |
| SU | 1686449 A2 | 10/1991 |
| WO | 84/00628 | 2/1984 |
| WO | WO94/20906 | 9/1994 |
| WO | WO 00/49488 * | 8/2000 |

OTHER PUBLICATIONS

1992 Symposium of VLSI Circuits Digest of Technical Papers, "EEPROM for Solid State Disk Applications", S. Mehoura et al., SunDisk Corporation. Santa Clara, CA. R.W. Gregor et al., AT&T Bell Laboratories. Allentown, PA. pp. 24 and 25.

Mendel Rosenblum and John K. Ousterhout, The Design and Implementation of a Log-Structured File System, article, 1991, 15 pgs., Berkeley, USA.

Brian Dipert and Markus Levy, Designing with Flash Memory, book, Apr. 1994, 432 pages, Annabooks, San Diego, USA.

Science Forum, Inc., Flash Memory Symposium '95,symposium, 1995, 13 pgs.; Hongo,Bunkyo-ku, Tokyo.

Ross S. Finlayson and David R. Cheriton, An Extended File Service Exploiting Write-Once Storage, article, 1987, 10 pgs. ACM.

Jason Gait, The Optical File Cabinet: A Random-Access File System for Write-Once Optical Disks, article, Jun. 1988, 12 pgs., Beaverton, Oregon.

Henry G. Baker, Memory Management, book, 1995, 19 pgs., Springer-Verlag Berlin Heidelberg, Germany.

Sape J. Mullender and Andrew S. Tanenbaum, A Distributed File Service Based on Optimistic Concurrency Control, article, 1985, 12 pgs., ACM.

Hiroshi Nakamura, Junichi Miyamoto, Kenichi Imamiya and Yoshihisa Iwata, A Novel Sense Amplifier for Flexible Voltage Operation NAND Flash Memories, symposium, 1995, VLSI Circuits Digest of Technical Papers,, 2 pgs.

Hiroshi Nakamura, Junichi Miyamoto, Kenichi Imamiya, Yoshihisa Iwata, Yoshihisa Sugiura and Hideko Oodaira, A Novel Sensing Scheme with On-Chip Page Copy for Flexible Voltage NAND Flash Memories, article, Jun. 1996, 9 pgs.,, vol. E79-C, No. 6.

Takaaki Nozaki, Toshiaki Tanaka, Yoshiro Kijiya, Eita Kinoshita, Tatsuo Tsuchiya and Yutaka Hayashi, A 1-Mb EEPROM with MONOS Memory Cell for Semiconductor Disk Application, article, 1991, 5 pgs., Journal Of Solid -State Circuits, vol. 26, No. 4.

Kai Hwang and Faye A. Briggs, Computer Architecture and Parallel Processing, book, 1984, McGraw-Hill, Inc., 2 pgs., US.

Walter Lahti and Dean McCarron, State of the Art: Magnetic VS. Optical Store Data in a Flash, article, 1990, 7 pgs., vol. 15, No. 12, McGraw-Hill, Inc., US.

Ron Wilson, Integrated Circuits; 1-Mbit flash memories seek their role in system design, article, Mar. 1, 1989, 2 pgs., No. 6, Tulsa, OK.

S. Mehroura, J.H. Yuan, R.A. Cemea, W.Y. Chien, D.C. Guteman, G. Samachisa, R.D. Noman, M. Mofidi, W.Lee, Y. Fong, A. Mihnea, E. Hann, R.W. Gregor, E.P. Eberhardt, J.R. Radosevich, K.R. Stiles, R.A. Kohler, C.W. Leung, and T.J. Mulrooney, Serial 9Mb F EEPROM for Solid State Disk Applications, symposium, 1992, 2 pgs., Mountain View, CA.

Steven H. Leibson, Nonvolatile, in-circuit-reprogrammable memories, article, Jan. 3, 1991, 12 pgs., EDN, Circle No. 12.

Ramon Caceres, Fred Douglis, Kai Li and Brian Marsh, Operationg System Implications of Solid-State Mobile Computers, article, 7 pgs., Oct. 1993, Workshop on Workstation Operting Systems.

Michael Wu and Wily Zwaenepoel, A Non-Volatile, Main Memory Storage Systems, 12 pgs., 1994, ACM, San Jose, CA USA.

Dave Bursky, Innovative flash memories match DRAM densities: available with a choice of features, flash memories are finding homes in many systems (includes related articles on the origins of flash, and on the differences between NAND and NOR flash memories), article, May 16, 1994, 9 pgs., Electronic Design, v.42, n.10, The Gala Group.

Anthony Cataldo, New flash enhancements up ante. (Intel's 28F400BV-120 and 28F004BV-120, Atmel's AT29BV010 and AT29BV020, and Samsung Semiconductor's KM29V32000 "flash" memory devices)(Product Announcement), article, Mar. 13, 1995, 4 pgs., Electronic News, v.41,n.2056, The Gale Group.

Sam Weber, *Flash* modules' portability, reusability, small size valued for a host of APPs-Consumer formats flocking to *flash*, article, Jul. 22, 1996, 9 pgs., Electronic Engineering Times, n911, CMP Media.

Toshiba, MOS Memory (Non-volatile), 1995, Data Book.

Stan Baker, But Integration Calls for Hardware, Software Changes: Flash: designers face the dawn of a new memory age, article, Sep. 12, 2003, 5 pgs., Electronic Engineering Times, 1990, N.619, 41, CMP Media.

Toshiba, Toshiba MOS Digital Integrated Circuit Silicon Gate CMOS, (TC58NS512DC) Mar. 21, 2001, 43 pgs., Data Book.

Toshiba Corporation, SMIL (Smartmedia Interface Library) Hardware Edition Version 1.00, Jul. 1, 2000, 36 pgs., Data Book.

Toshiba, Toshiba MOS Digital Integrated Circuit Silicon Gate, (TC58512FT), Mar. 5, 2001, 43 pgs., Data Book.

Toshiba, Toshiba MOS Digital Integrated Circuit Silicon Gate, (TC58DVM92A1FT00), Jan. 10, 2003, 44 pgs., Data Book.

Toshiba, Toshiba MOS Digital Integrated Circuit Silicon Gate, (TC58DVG02A1FT00), Jan. 10, 2003, 44 pgs., Data Book.

Toshiba, Toshiba MOS Digital Integrated Circuit Silicon Gate, (TH58100FT), Mar. 5, 2001, 43 pgs., Data Book.

35Nonvolatile Memory Technology Review, A Time of Change, Proceedings 1993 Conference, Jun. 22-24, 1993, Linthicum Heights, MD USA.

Toshiba Corporation, SMIL (Smartmedia Interface Library) Software Edition Version 1.00, Jul. 1, 2000, 136 pgs., Data Book.

Toshiba, MOS Memory (Non-Volatile), 1996, 279 pgs., Data Book.

Dan Auclair, Optimal Solid State Disk Architecture For Portable Computers, symposium, Jul. 9, 1991, 7 pgs., SunDisk Corporation.

Book-Computer Architecture and Parallel Processing, Kai-Hwang & Faye A. Brigss, McGraw-Hill Book Co., 1984, p. 64.

Magazine- :State of the Art: Magnetic VS. Optical Store Data in a Flash, by Walter Lahti and Dean McCarron, Byte magazine dated Nov. 1, 1990.311, vol. 15, No. 12, pp. 1-7.

* cited by examiner

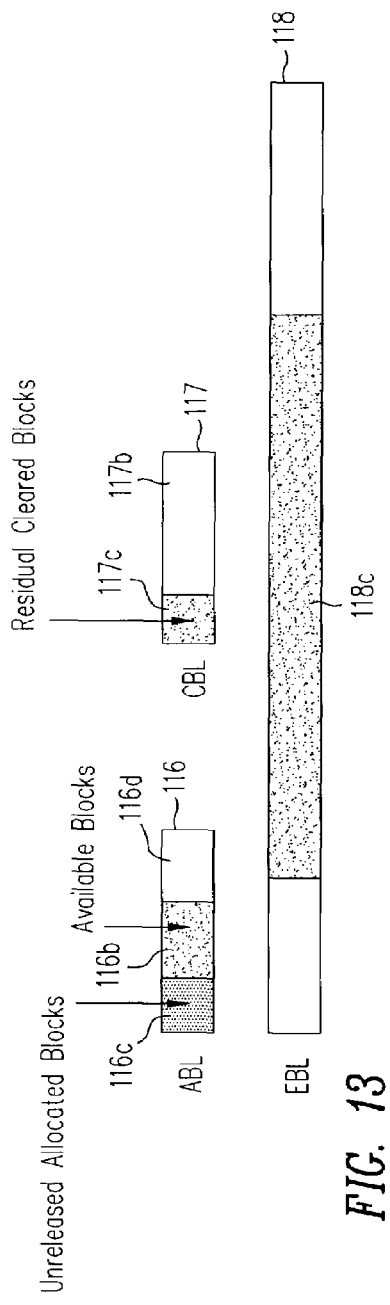
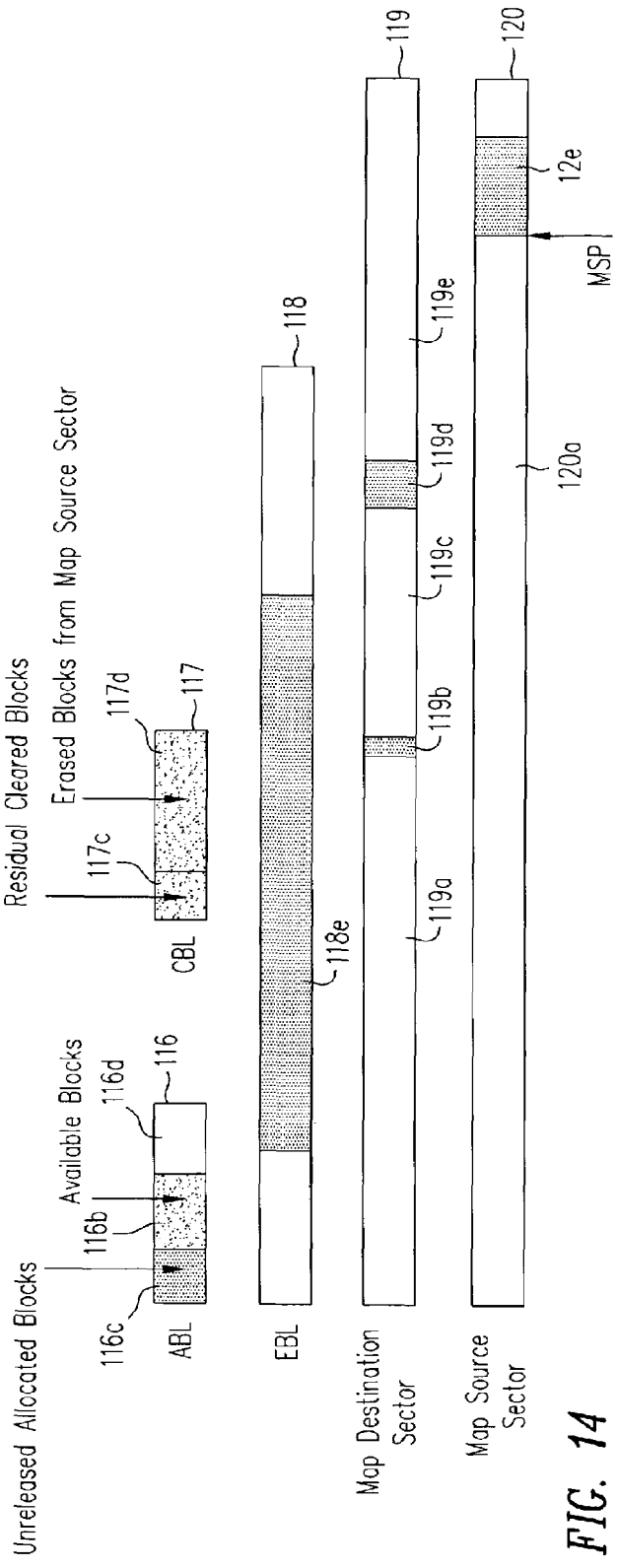
FIG. 13
FIG. 14

|     | Block Type | Sector Type | Field |
| --- | --- | --- | --- |
| 60 — | Data | Data sector | |
| 62 — | SAT | TSAT sector | TSAT Index (TSATI) |
| | | SAT sector | |
| 64 — | Map | Map sector | MZF (in header) |
| | | EBM sector | EBL |
| | | | EBLS |
| | | | EBLL |
| | | | EBC |
| | | | Map Count |
| | | | Map Index |
| | | | MSP |
| | | | MDP |
| | | | DCOB1 |
| | | | DCOB2 |
| | | | SCOB1 |
| | | | SCOB2 |
| | | | Write Pointers |
| | | | Last TSAT |
| | | | SATA Address |
| | | | SATA Index |
| 66 — | SAT Address (SATA) | SATA sector | |
| 68 — | Map Address (MA) | MA sector | |
| 70 — | Bad Block List (BBL) | BBL sector | |
| 72 — | Boot Block (BB) | BB Parameter (BBP) sector | |
| | | Information Structure sector | |
| | | Identification sector | |
| | | MA Address (MAA) sector | |
| 67 — | Firmware | Firmware sector | |

*FIG. 18*

| Data Structure |
|---|
| Data Write Sector List (DWSL) |
| Data Relocation Sector List (DRSL) |
| System Write Sector List (SWSL) |
| System Relocation Sector List (SRSL) |
| Data Current Obsolete Block 1 (DCOB1) |
| Data Current Obsolete Block 2 (DCOB2) |
| System Current Obsolete Block 1 (SCOB1) |
| System Current Obsolete Block 2 (SCOB2) |
| DWP, DRP, SWP, SRP Write Pointers |
| Allocation Block List (ABL) |
| Cleared Block List (CBL) |
| SAT Cache |

FIG. 19

METHOD OF WRITING DATA TO NON-VOLATILE MEMORY

CROSS REFERENCE TO RELATED APPLICATION

This application claims the benefit of the priority date of our earlier filed British Application No. 0123415.2, entitled "Method of Writing Data To Non-Volatile Memory", filed on Sep. 28, 2001.

BACKGROUND OF THE INVENTION

1. Field of the Invention

The present invention relates generally to a method and apparatus for writing data to non-volatile memory and in particular to a method and apparatus for writing data to flash memory in order to ensure the uniform distribution of use over a prolonged period of operation.

2. Description of the Prior Art

In known memory systems it is common for non-volatile memory such as the flash memory of the memory systems to have wear out mechanisms within their physical structures, i.e. a block within the flash memory may experience failure after a cumulative number of operations. However, known data management methods typically do not perform block erasure in Flash memory in real time leading to the accumulation of blocks in Flash memory which include obsolete versions of sectors. It is also the case that in known systems the physical address for writing a sector is dependent on the logical address of the sector thus logically non-contiguous sectors are written in non-contiguous physical address and logical to physical.

Thus, a need arises to obviate or mitigate at least one of the aforementioned problems.

SUMMARY OF THE INVENTION

An object of the present invention is to reduce the number of read and write accesses to the non-volatile memory for control data structures, thereby increasing the write speed of the memory system for host data.

A second object of the invention is to obtain even use of blocks in the non-volatile memory for storage of data over a long period of operation, and to avoid "hotspots" in non-volatile memory usage, thereby increasing the reliability of the memory system.

According to a first aspect of the invention, there is provided a controller connected to a non-volatile memory and including a volatile memory, wherein the controller maintains lists in volatile memory of blocks in the non-volatile memory allocated for storage of logical sector data and of blocks recently erased in the non-volatile memory.

The controller transfers information from the lists in volatile memory to control data structures in the non-volatile memory less frequently than the contents of the lists in volatile memory are changed, such that the lists in volatile memory can be reconstructed at any time from existing information in the non-volatile memory.

Preferably, information from the lists in volatile memory is transferred to control data structures in the non-volatile memory concurrently with logical to physical mapping information for sectors from other lists in volatile memory.

According to a second aspect of the invention, there is provided a controller connected to a non-volatile memory and including a volatile memory, wherein the controller maintains a first list of all blocks in the non-volatile memory which are in the erased state and which are not included in other lists. The controller maintains a second list of blocks in the non-volatile memory which have been recently erased.

The foregoing and other objects, features and advantages of the present invention will be apparent from the following detailed description of the preferred embodiments which make reference to several figures of the drawing.

IN THE DRAWINGS

FIG. 13 illustrates a schematic representation of the state of the data structures following the ABL and CBL compaction operation;

FIG. 14 shows a schematic representation of the state of the data structure following the map to CBL operation;

FIG. 18 shows Table 1.

FIG. 19 shows Table 2.

DETAILED DESCRIPTION OF THE PREFERRED EMBODIMENTS

Figure 1:
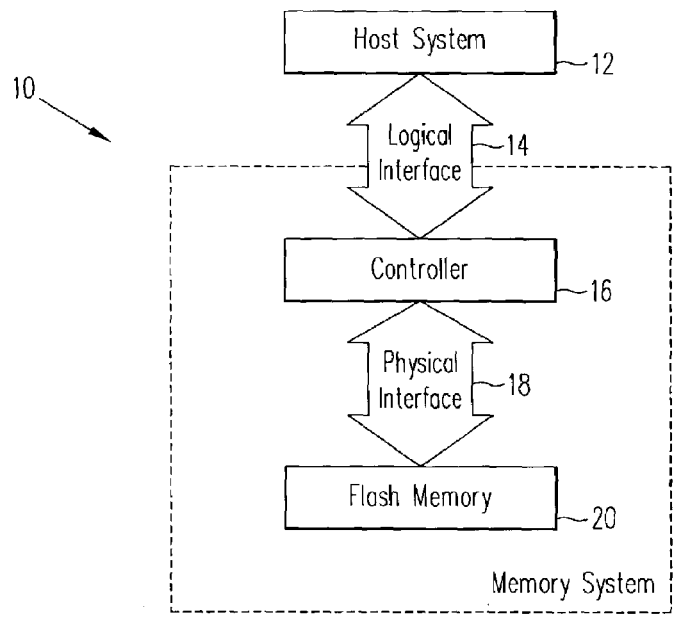
FIG. 1 shows a host system and flash memory system arrangement in accordance with an embodiment of the present invention.

A Flash disk device, such as that shown in FIG. 1, is a memory system which presents the logical characteristics of a disk storage device to a host system 12, and which uses Flash semiconductor memory 20 as its physical data storage medium. A Flash disk memory system 10 requires a controller 12 to manage the physical storage medium of the system 10 according to algorithms which create the logical characteristics of a disk and, in this case, it is the flash memory 20 and controller 16 which are connected by physical interface 16 which form the memory system 10. The controller 16 of the memory system 10 connects the system 10 to the host 12 via logical interface 14.

In this case the flash memory 20 comprises a plurality of flash chips which are formed of a plurality of flash blocks. The logical interface 14 to the memory system 10 allows data to be written to and read from the system 10 in fixed-size units called sectors, each containing 512 bytes of data, which can be randomly accessed. Each sector is identified by a logical address which in this case is a sequential Logical Block Address (LBA).

In the present arrangement data may be written to a sector even if the sector already includes data. The protocols at the logical interface 14 can, in this case, support, read or write access to the system 10 in multi-sector blocks of logically contiguous sector addresses. These protocols conform to industry standards such as ATA, CompactFlash, or Multi-MediaCard thus allowing the memory system 10 to be interchangeable between different host systems and not limited to use with host 12.

The physical interface 18 from controller 16 to Flash Memory 20 allows data to be written to and read from Flash memory 20 in fixed-size units which in this case are called physical sectors and each of which can be accessed randomly with each typically having sufficient capacity for 512 bytes of data from the host system plus 16 bytes of overhead data appended by the controller 16. Each physical sector is identified by a physical sector address, which normally has separate components which respectively identify the Flash chip within the memory subsystem, the Flash block within the Flash chip, and the physical sector within the Flash block of the memory 20 to which the physical sector is written.

Within the system 10 shown, data may only be written to a physical sector if the sector has previously been erased. The Flash memory 20 is erased in response to a command at the physical interface in units of a Flash block, which typically includes 32 physical sectors. The relative times for performing operations within the Flash system 10 to read a physical sector, program a physical sector, and erase a Flash block are typically in the ratio 1:20:200.

In the arrangement of FIG. 1 the controller 16 is a Cyclic Storage controller which is a Flash media management controller in which a method of ensuring uniformity of distribution of use is implemented wherein the media management algorithms which implement this method are implemented as firmware by a processor within the controller.

Figure 2:
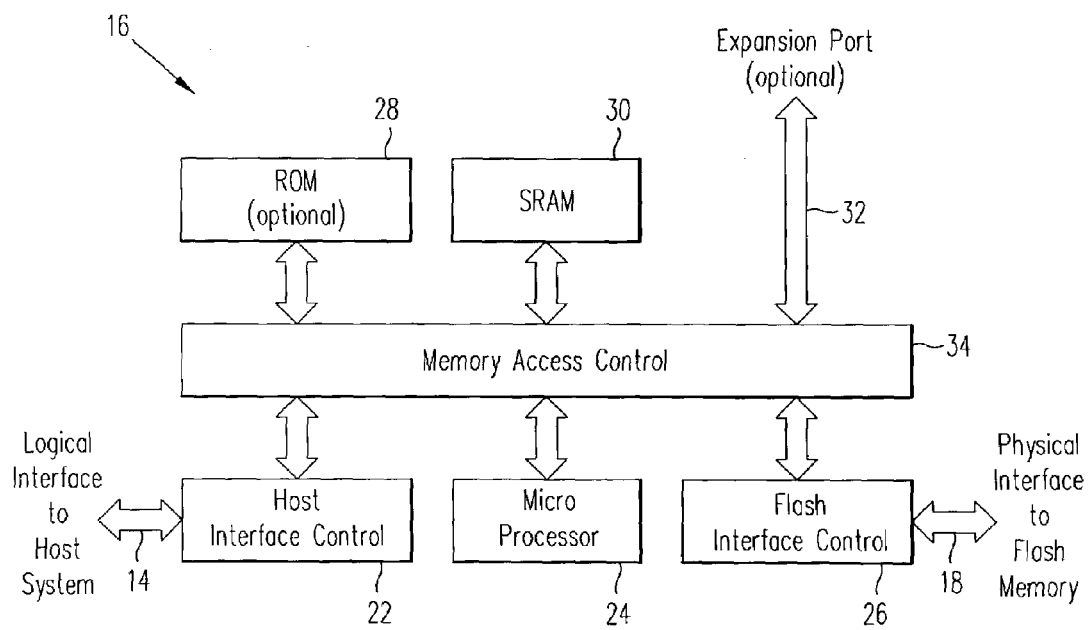
FIG. 2 illustrates the hardware architecture of the controller of the system of FIG. 1.

With reference to FIG. 2 there is shown optimized hardware architecture which is defined for the Cyclic Storage controller 16. In this case the controller hardware is a dedicated architecture in a separate integrated circuit.

The controller 16 comprises host interface control block 22, microprocessor 24, flash interface control block 26, ROM 28, CRAM 30 and expansion port 32, each of these being inter-connected by memory access control bus 34.

Cyclic Storage Flash media management algorithms are implemented by firmware running on microprocessor 24 and the controller 16 is responsible for all Flash media management functions and for the characteristics of the logical interface 14 presented to host 12.

The host interface control block 22 provides the path for data flow to and from host system 12 via logical interface 14.

As in this case, the controller 16 is in the form of a dedicated integrated circuit the host interface control block 22 provides logical interface 14 which conforms to an industry standard protocol as well as a command register and set of taskfile registers which provide the route for the microprocessor 24 to control the logical characteristics of the interface 14.

The host interface control block 22 also allows for a sector of data to be transferred in either direction across the logical interface 14 between to the host system 12 and the controller's SRAM 30 by a direct memory access (DMA) operation without intervention from the microprocessor 24.

The Flash interface control block 26 provides the path for data flow to and from Flash memory 20, and controls all operations which take place in the Flash memory 20. The operations taking place in Flash memory 20 are defined and initiated by the microprocessor 24, which loads parameter and address information to the flash interface control block 26.

The set of operations which typically take place are the transfer of a physical sector to Flash memory 20, the transfer of a physical sector from Flash memory 20, the programming of a physical sector into flash memory 20, the erasing of a Flash block, and the reading of the status of Flash memory 20.

Similarly a physical sector of data may be transferred in either direction across the physical interface 16 between the Flash memory 20 and the controller's SRAM 30 by DMA operations without intervention from the microprocessor 24. The organization of the 512 bytes of host data and 16 bytes of overhead data within a physical sector which is transferred to Flash memory 20 is determined within the Flash interface control block 26, under the control of parameters loaded by the microprocessor 24.

The Flash interface control block 26 also generates a 12-byte error correcting code (ECC) which is transferred to Flash memory 20 and programmed as overhead data within each physical sector, and which is also verified when a physical sector is transferred from Flash memory 20.

The microprocessor 24 controls the flow of data sectors through the memory access control bus, or datapath, 34 or of the controller 16, implements the Flash media management algorithms which define the sector and control data storage organization in the Flash memory 20, and defines the characteristics of the logical interface 14 to host system 12. In this case the microprocessor 24 is a 32-bit RISC processor.

The memory access control bus 34 allows transfer of information between the microprocessor 24, host interface control block 22, and the Flash interface control blocks 16, as well as between the host interface control block 22, the flash interface control block 26 and a memory block 30.

The microprocessor 24, host interface control block 22, and Flash interface control block 26 may each be the master for a transaction on the memory access control bus 34. Bus access is granted to requesting masters on a cycle-by-cycle basis.

The SRAM block 30 stores all temporary information within the controller 16, this storing function includes the buffering of sector data and storage of control data structures and variables, as well as firmware code.

The ROM 28 is included in the controller 16 for storage of code for execution by the microprocessor 24, or of information required by other hardware blocks within the controller.

The inclusion in the controller architecture of an expansion port 32 gives access to external hardware functions, RAM or ROM from the memory system 10.

During the operation of the controller all sector data being transferred between the logical interface 14 to host system 12, and the physical interface 18 to Flash memory 20 is buffered in the SRAM 30. Sufficient capacity in the SRAM 30 is allocated for buffering of two sectors of data to allow concurrent transfers of successive sectors at the host and Flash interfaces. Data transfer between the logical host interface 14 and SRAM 30 is performed by DMA with the host interface control block 22 acting as bus master. Data transfer between the physical Flash interface 18 and SRAM 30 is performed by DMA with the Flash interface control block 26 acting as bus master.

As the controller 16 is in the form of a dedicated integrated circuit, the host interface control block 22 provides a logical interface which conforms to an industry standard protocol, and a command register and set of taskfile registers provide the route for the microprocessor 24 to control the logical characteristics of the interface 14. Command, address and parameter information is written to these task file registers by the host 12, and read by the microprocessor 24 for execution of the command. Information is also written to the registers by the microprocessor 24 for return to the host 12.

Figure 3:
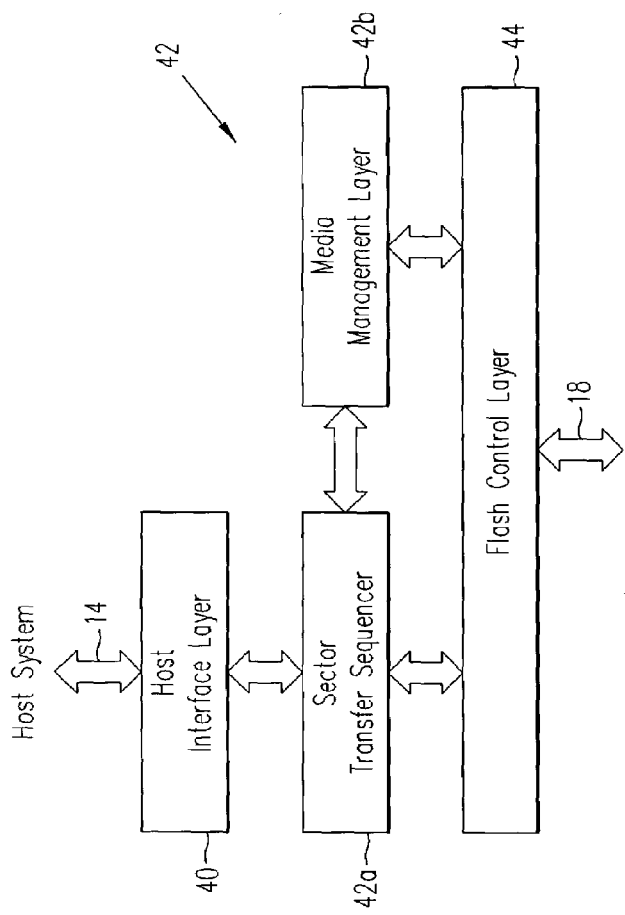
FIG. 3 depicts the layered firmware structure which performs the media management operations according to an embodiment of the present invention.

In FIG. 3 there is illustrated the layered structure of the firmware which performs the Cyclic Storage Flash media management operations. The firmware has three layers, the first being the host interface layer 40, the second layer 42 comprising the sector transfer sequencer 42a and the media management layer 42b and the third being the flash control layer 44.

These three firmware layers 40, 42 and 44 control the transfer of data sectors between the logical interface 14 to host 12 and the physical interface 18 to Flash memory 20. However, the firmware layers do not directly pass data, instead data sectors are transferred by the hardware blocks of the controller 16 and therefore do not pass through the microprocessor 24.

The host interface layer 40 supports the full command set for the host protocol. It interprets commands at the host interface 14, controls the logical behaviour of the interface 14 according to host protocols, executes host commands not associated with the transfer of data, and passes host commands which relate to data in Flash memory to be invoked in the layers below. Examples of such commands are:

Read logical sector (single or multiple),
Write logical sector (single or multiple),
Erase logical sector (single or multiple), as well as other disk formatting and identification commands.

The sector transfer sequencer 42a receives interpreted commands relating to logical data sectors from the host interface layer 40 and thus invokes the Flash media management layer 42b for logical to physical transformation operations, and invokes the Flash control layer for physical sector transfers to or from Flash memory. The sector transfer sequencer 42a also perform sector buffer memory management. Another function of the sequencer 42a is to create a sequence of sector transfers, at the host interface 14 and Flash memory interface 18, and a sequence of operations in the media management layer 42b, in accordance with the command received from the host 12 the level of concurrent operations which is configured for the Flash memory 20.

The media management layer 42b performs the logical to physical transformation operations which are required to support the write, read or erasure of a single logical sector. This layer is responsible for the implementation of Cyclic Storage media management algorithms.

The Flash control layer 44 configures the Flash interface control block 26 hardware to execute operations according to calls from the sector transfer sequencer 42a or media management layer 42b.

The media management functions which are implemented within the media management layer 42b of the controller firmware create the logical characteristics of a disk storage device in the memory system 10 which uses Flash semiconductor memory 20 as the physical data storage medium.

The effectiveness of the media management performed by the media management functions of the media management layer 42b is measured by its speed for performing sustained writing of data to the memory system 10, its efficiency in maintaining its level of performance when operating with different file systems, and in this case, in host 12, an the long-term reliability of the Flash memory 20.

Data write speed is defined as the speed which can be sustained when writing a large volume of contiguous data to the memory system 10. In some cases, when the sustained data write rate of a memory system is being tested, the volume of data to be written may exceed the capacity of the memory system 10 and therefore logical addresses may be repeated.

Sustained write speed is determine by the sector data transfer speed at the logical interface 14 to the host 12, and the physical interface 18 to Flash memory 20, as well as the overhead percentage of accesses to Flash memory 20 at the physical interface 18 for Flash page read and write operations and Flash block erase operations which are not directly associated with storage of data sectors written by the host 12 at the logical interface 14. In this case the control data structures and algorithms which are employed should ensure that access to Flash memory 20 for control functions is required at a much lower frequency than for host sector write. The sustained write speed is also determined by the processing time within the controller 16 for media management operations, and the page read and program times, and block erase times within the Flash memory 20.

In order for the memory system to operate efficiently when having file systems with different characteristics, the Media management algorithms for the organization of host data and control data structures on Flash memory 20 are appropriately defined and data write performance is maintained in each environment.

In a first embodiment, the file systems implementing the MS-DOS standard are provided with at least one of the following characteristics: the host 12 writing data sectors in clusters using multiple sector write commands; the host 12 writing data sectors using single sector write commands; the host 12 writing some sectors with single sector write commands in an address space which is shared with clustered file data; the host 12 writing non-contiguous sectors for MS-DOS directory and FAT entries with single sector write commands; the host 12 writing non-contiguous sectors for MS-DOS directory and FAT entries interspersed with contiguous sectors for file data;

and/or the host may rewrite sectors for MS-DOS directory and FAT entries on a frequent basis. It is a feature of Flash memory, and in this case the Flash memory 20 of the memory system 10, that it has a wear-out mechanism within the physical structure of its cells whereby a block of flash memory may experience failure after a cumulative number of operations. Typically, this is in the range of 100,000 to 1,000,000 program/erase cycles. In light of this the cyclic storage controller 16 of the present arrangement implements a process of wear-leveling to ensure that "hot-spots" do not occur in the physical address space of the Flash memory 20 and that utilization of Flash blocks is uniformly distributed over a prolonged period of operation.

The Cyclic Storage media management algorithms are implemented within memory system 10 and perform the Media management operation of the physical Flash memory 20 within the system 10. The cyclic storage media management algorithms comprise four separate algorithms, namely the Data Write algorithm which controls the location for writing host information to, the Block Erase algorithm which controls erasure of areas of Flash memory 20 containing obsolete information, the Block Sequencing algorithm which controls the sequence of use of Flash blocks for storing information, and the Address Translation algorithm which controls the mapping of host logical addresses to physical memory addresses.

The method of Cyclic Storage media management implemented by these algorithms embodies the principle that data is written at physical sector locations in Flash memory 20 which follow the same order as the sequence in which the data is written. This is achieved by writing each logical data sector at a physical sector position defined by a cyclic write pointer.

Figure 4A:
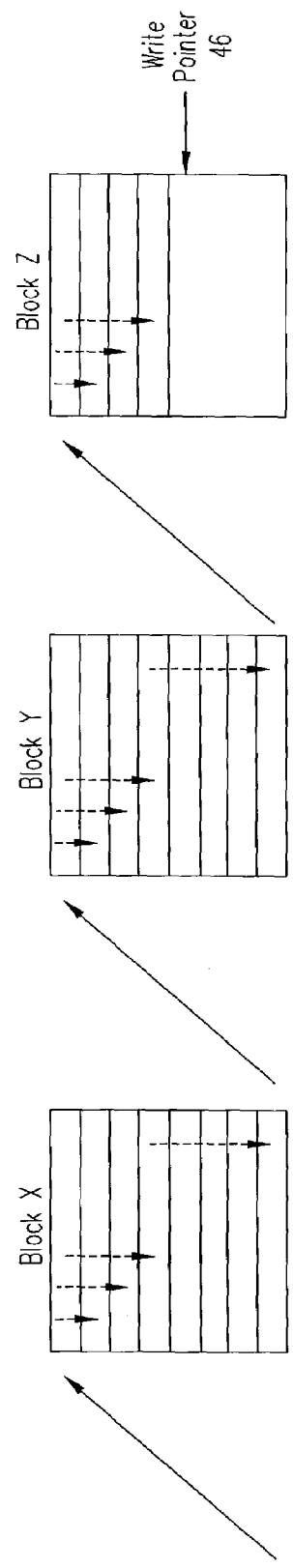
FIG. 4a shows a schematic representation of the write operation according to an embodiment of the present invention.

A schematic representation of the write operation of the cyclic storage media management method is shown in FIG. 4A. The write pointer, in this case data write pointer (DWP) 46 moves sequentially through the sector positions of Flash block X in Flash memory 20, and continues through the chain of blocks & and Z in a manner defied by the block sequencing algorithm. Each block X, Y and Z is a physical structure in Flash memory 20 which, in this case, comprises 32 sector locations which can be erased in a single operation.

Logical data sectors are generally written in files by a file system in the host 12, and the Cyclic Storage Data Write Algorithm locates the first sector of a file at the next available physical sector position following the last sector of the preceding file. When a file is written by host 12 using logical sectors for which valid data already exists in the device, the previous versions of the sectors become obsolete and the blocks containing them are erased according to the Block Erase Algorithm. In order to erase a block containing obsolete file sectors it is, in some cases, necessary to relocate some valid sectors of another file. This generally occurs when a block includes sectors of the head of a file, as well as sectors with unrelated logical addresses from the tail of a different file.

A second write pointer, in this case data relocate pointer DRP 47, is used for writing relocated sectors in order to avoid sectors of one file fragmenting a block containing sectors of another file. The use of a separate relocation pointer significantly reduces the fragmentation of blocks containing a file, leading to minimum requirement for sector relation and consequent maximum file write performance.

A host file system is used which also writes sectors containing system information, such as directory or FAT sectors in the DOS file system, and these are generally written immediately before and after a group of sectors forming a file. A separate system pointer, system write pointer SWP 48, is used for this host file system in order to define the physical write location for system sectors, which are identified by their logical address, in order to separate system sectors from file data sectors and avoid them being treated in the same way. This avoids a small group of system sectors being "sandwiched" between the tail of one file and the head of another. These systems sectors contain information about many files, and are generally re-written much more frequently than data for a file. "Sandwiched" system sectors would cause frequent relocation of file data sectors and thus the use of system pointer SWP 48 minimizes the requirement for data sector relocation and maximizes file write performance.

A fourth pointer, system relocate pointer SRP 49, is used for relocation of system sectors, analogous to the relocation pointer DRP 47 for file data sectors.

To summarize, the four write pointers are:

Data write pointer, DWP 46, which is used to define the physical location for writing file data sectors transmitted by a host system;

System write pointer, SWP 48, which is used to define the physical location for writing system sectors transmitted by a host system wherein system sectors are identified by their logical address, in accordance with the characteristics of the host file system in use;

Data relocation pointer, DRP 47, which is used to define the physical location for writing file data sectors which occasionally are to be relocated prior to a block erasure for recovery of capacity occupied by obsolete file data sectors; and System relocation pointer, SRP 49, which is used to define the physical location for writing system sectors which are being relocated prior to a block erasure for recovery of capacity occupied by obsolete system sectors.

Figure 4B:
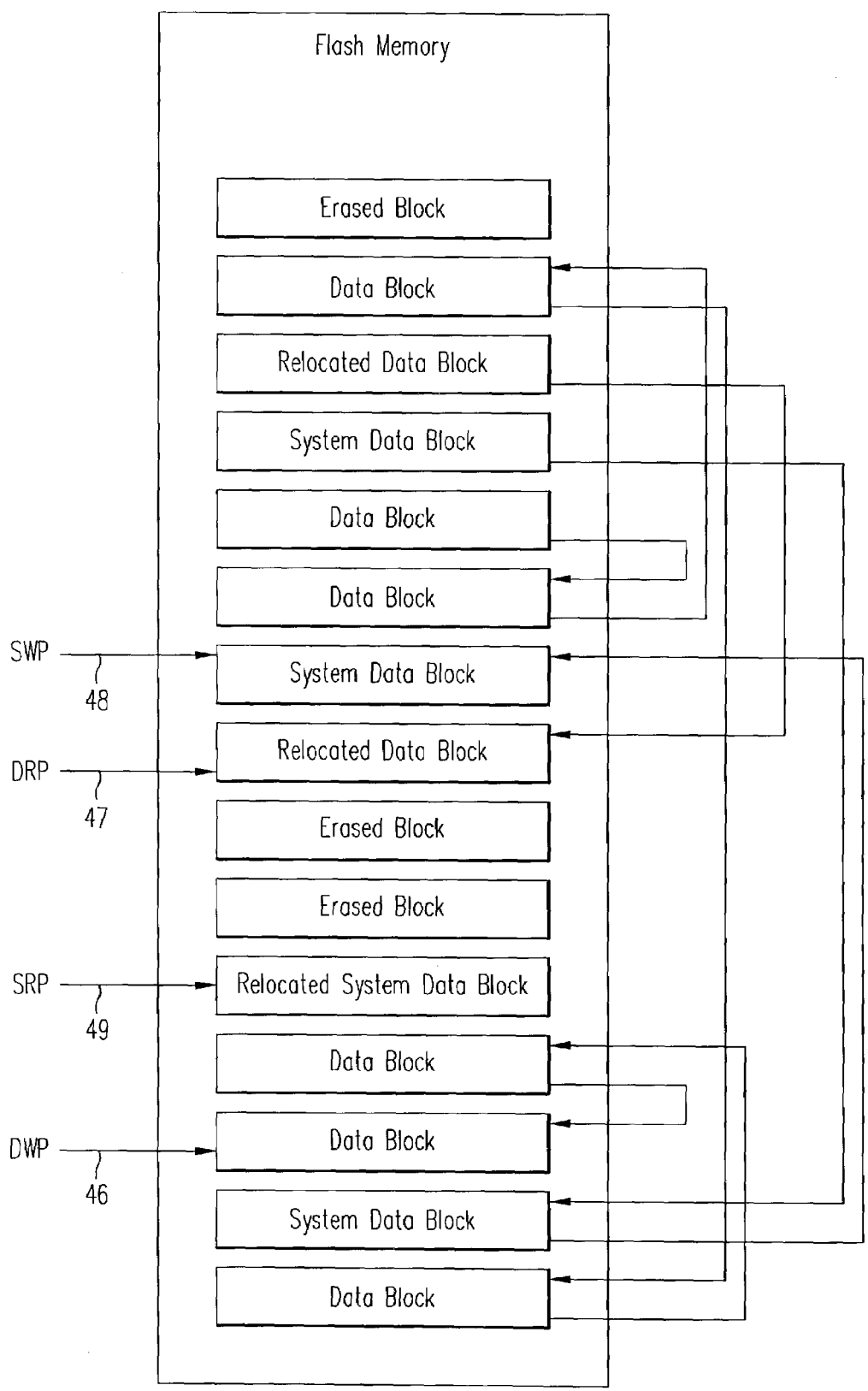
FIG. 4b illustrates a schematic representation of the write and relocate operations of an embodiment of the present invention.

A block generally includes data associated with only a single write pointer and this results in four separate chains of blocks existing, one for each writer pointer, this is shown in FIG. 4b. However, the same write and relocation algorithms of the cyclic storage algorithms apply to each write pointer 46, 47, 48 and 49.

This scheme for locating a sector to be written at the first available location following the preceding sector, combined with usage of multiple write pointers, is fully flexible, and provides high performance and total compatibility for all host write configurations, including single sector data and data in clusters of any size.

However, the Cyclic Storage media management method is defined not to allow the existence of a large number of obsolete data sectors nor to implement background operations for functions such as garbage collection. Typically only two blocks containing obsolete sectors are allowed to exist for each of the Data Write Pointer DWP 46 and System Write Pointer SWP 48, and block erasure is performed as a foreground operation during sector write sequences.

This method of management indicates that the logical capacity of the flash memory does not have to be reduced to allow for the existence of a large volume of obsolete data, the data integrity is significantly improved by the absence of background operations, which are susceptible to interruption by power-down initiated by the host; and the pauses in data write sequences are short because erase operations are required for only a single block at a time.

If an obsolete data sector is created in a new block associated with either of the write pointers, then the existing "obsolete block" is eliminated by erasure, following sector relocation within the blocks if required.

Erase sector commands sent from a host 12 are supported by marking the target sector as obsolete, and allowing its erasure to follow according to the Block Erasure algorithm.

The Cyclic Storage block sequencing algorithm determines the sequence in which blocks within the flash memory 20 are used for the writing of new or relocated data, and is therefore responsible for ensuring that no block experiences a number of write/erase cycles which exceeds the endurance limit specified for the Flash memory system 20 which is being used.

When a logical sector is written by the host, any previous version which exists in the memory's system is treated as obsolete data. The block erase algorithm ensures that blocks which contain obsolete data sectors are erased immediately, to allow recovery of the capacity occupied by these sectors. The physical memory capacity of the system 10 is therefore occupied by valid data for logical sectors written by the host, plus a small number of proprietary Cyclic Storage control data structures and a number of erased blocks. Immediately after initial formatting, of the flash memory 10, the capacity of the memory 10 consists almost entirely of erased blocks. When the host 23 has written at least once to all sectors in its logical address space, the device is considered to e logically full and its physical capacity is occupied almost entirely by valid data sectors, with a small number of erased blocks maintained for correct device operation. An increased number of erased blocks will be created only if the host 12 executes commands to erase logical sectors.

Erased blocks which are allocated for use by one of the write pointers, or for storage of control data structures are taken from a pool of available erased blocks. A block is never erased in response to a need to perform a write operation to that specific block, the block sequencing algorithm determines the order of allocation for data write operations of blocks in the erased pool. The next available block according to the algorithm is allocated, independent of whether the requirement is, for use by one of the write pointers or for a control data structure.

The implementation of these algorithms which perform the cyclic storage media management allows increased system flexibility by operating on individual sectors of the flash memory 20 and separately tracking the logical to physical address mapping of every sector in its logical address space. A sector address table is maintained in the Flash memory 20 which includes the physical address for every logical sector. In addition, every sector is written with a header containing its logical address, providing a means of verifying sector identity and ensuring maximum data integrity.

The data write algorithm, with its use of cyclic write pointers, provides the capability for tracking the sequence of sector writing using the logical addresses in the headers of sectors in sequential physical positions. This feature provides total data security even when the logical to physical address mapping records for recently written sectors are temporarily held in volatile controller memory SRAM 30 and not in Flash memory. Such temporary records can be reconstructed from the data sectors in Flash memory 20 when a system 10 in which the Cyclic Storage algorithms are implemented is initialized. It is therefore possible for the sector address table in Flash memory 20 to be updated on an infrequent basis, leading to a low percentage of overhead write operations for control data and a high sustained data write rate.

Figure 5:
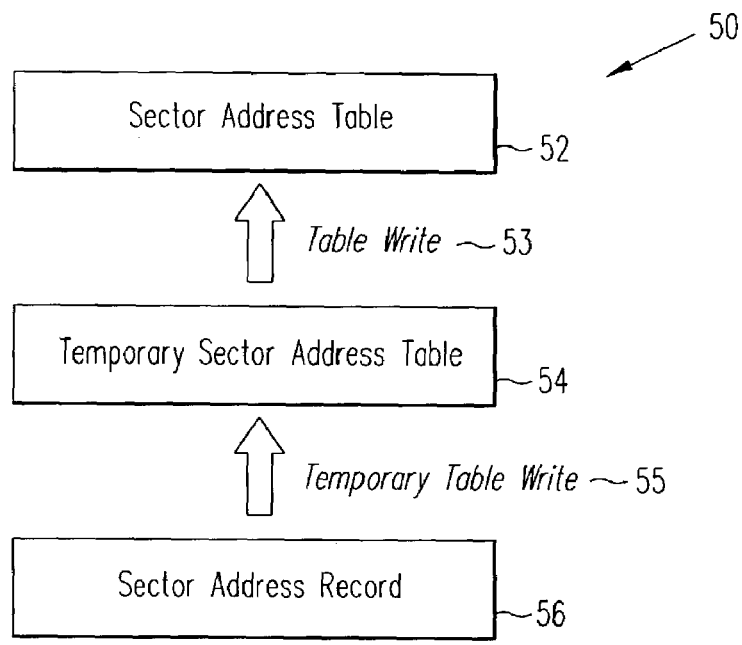
FIG. 5 depicts a schematic representation of the three level hierarchy of mapping structures of the address translation process in accordance with an embodiment of the present invention.

In FIG. 5 there is shown a schematic representation of the address translation process which uses a three level hierarchy of mapping structures 50 which is performed in the memory system 10.

The three levels of the hierarchy of the mapping structures is the sector address table 52, which is a master table containing a physical address for every logical sector stored in the system 10 and which is stored in Flash memory 20. Structures in the two lower levels of the hierarchy 54 and 56 provide for reducing the frequency at which write operations need to occur to the sector address table.

The sector address record 56 is a list stored in the controller's volatile memory SRAM 30 of logically contiguous sectors which have been written to system 10. This list allows the physical address of any logical sector which it includes to be determined without need for access to Flash memory 20. It may also be reconstructed during device initialization from the sequence of recently-written sectors which may be traced in the Flash memory 20. The intermediate temporary sector address table 54 is contained in Flash memory 20 and is updated with the contents of the sector address record 56 when the list becomes full. The intermediate temporary sector address table 54 is in the same format as the sector address table 52, and allows physical address data updates to specific blocks of the sector address table 52 to be accumulated to allow a more efficient table write process to be performed. The temporary table 54 allows the physical address of any logical sector contained in it to be determined without need for access to the sector address table 52.

This hierarchy of mapping structures 50 is maintained with an infrequent requirement for write operations to Flash memory and efficiently supports logical to physical address translation in such a way which provides total security of sector address information is provided, even if electrical power is unpredictably removed from the system 10.

The data structures required to support the Cyclic Storage media management algorithms are stored principally in Flash memory 10 together with the host data sectors, with only a very limited amount of control data being held temporarily in the control processor's volatile RAM 30. Information held in the volatile memory 30 is non-critical, and can be reconstructed from Flash memory 10 if the power supply is interrupted.

All host data and control data structures in Flash memory 20 are written and read as physical sectors with identical logical format, comprising 512 bytes of information plus a 4-byte header defining sector type plus other type-dependent information, protected by 12 bytes of ECC.

Within this description, physical sector has the meaning of a 528-byte data structure which is written by the controller to Flash memory. The term does not denote a group of memory cell locations within Flash memory. The term does not denote a group of memory cell locations within Flash memory.

Physical sectors of similar type are grouped into dedicated blocks, where a block is a fundamental physical structure in Flash memory 20, in this case comprising sixteen physical sector locations, which can be erased in a single operation. Sectors of different types may not be located in the same block.

Cyclic storage media management algorithms operate on virtual blocks where a virtual block is a group of one or more Flash blocks in Flash memory 20. Cyclic storage algorithms treat a virtual clock as if it were a single Flash block.

In Table 1, FIG. 18 there is listed a selection of block types of flash system 10. The first of these is the data block 60 which includes host data sectors associated exclusively with a single write pointer (DWP 46, DRP 47, SWP 48 or SRP 49) wherein each physical data sector includes information originally written by the host system.

The Sector Address Table 52 is a list of addressing Flash memory of physical sectors corresponding to all sectors in the system 10, which is spread over multiple SAT blocks 62. The SAT 52 includes one entry for each sector, ordered sequentially according to logical address. The nth entry in the SAT 52 includes the physical address for the sector having logical address n. A SAT block 62 includes entries for a logically contiguous set of sectors in a region of logical address space.

Each SAT block 62 is divided into two equal partitions, one dedicated to SAT entries and the other to temporary SAT (TSAT) entries. The TSAT partition of the block is an area in which TSAT sectors, which are written during a control write operation, are temporarily stored before being written in the SAT partition of the block 62. An index of valid TSAT sectors and their position in the TSAT partition is maintained in the TSAT Index (TSATI) field in the most recently written TSAT sector.

When a TSAT sector is written, it is located at the first available sector position in the TSAT partition of the SAT block 62 to which the sector relates. A SAT block 62 is rewritten when its TSAT partition is full. Valid TSAT sectors in the previous TSAT partition replace the corresponding SAT sectors in the SAT partition, and the TSAT partition is left empty.

Each SAT sector includes SAT entries for a logically contiguous set of sectors and comprises 128 entries of 3 bytes each.

Each TSAT sector is a sector in the TSAT partition of a SAT block 62 and has an identical format to a SAT sector. The TSAT sector includes SAT entries for a logically contiguous set of sectors and comprises 128 entries of 3 bytes each.

The TSATI of each TSAT includes an index to the addresses of all valid TSAT sectors in the SAT block 62 in which it is located. A TSATI is written in each TSAT sector during each TSAT write operation, however, only the most recently written TSATI in a SAT block is valid.

The Map block 64 includes Map sectors which define the erased blocks in the system 10, and Erased Block Management (EBM) sectors, in this case. Only the last written EBM sector is valid.

In this arrangement the Map block 64 is a bitmap structure having one bit for each block in the system 10. These bits are used to indicate the erase state of each block. Each bit in the Map block 64 is set to logical "O" if the corresponding block is in the erased state. Bits corresponding to blocks present in the Allocation Block List or Erased Block List are always set to logical "1" in the Map block 64. The Map block 64 for the system 10 is able to occupy more than one Map sector, depending on the size of the system 10. In this case, each Map sector records the erase status of 4096 blocks within a specific physical address range. The bitmap within a Map sector 646 is subdivided into 16 zones, and flags are maintained to indicate the presence of erased blocks in each zone.

Any block which does not contain valid data structures and which is not included within a Map sector, the Allocation Block List or the Erased Block List is never used by the block allocation algorithm and is therefore inaccessible for storage of host or control data structures. This provides a simple mechanism for excluding blocks with defective locations from the accessible Flash memory address space.

The Map Zone Flag (MZF) field of the Map Block 64 is a bitmap defining the presence of erased blocks in each zone of a Map sector bitmap and is located in the header of the Map sector to which it corresponds.

The Erased Block Management (EBM) sector of the Map Block 64 includes information fields which are required for management of erased blocks. Only the last written EBM sector in the Map block is valid.

The Erased Block List (EBL) field of the EBM sector is a list of erased block addresses which defines which blocks are available for allocation for use. The EBL field is a cyclic list within a fixed region of the EBM sector 64a and its bounds are defined by the EBL start (EBLS) and EBL length (EBLL) fields of the EBM sector.

The EBLS field is a pointer which defines the address, within the EBM sector, of the first entry of the EBL. The EBLL field defines the length of the EBL. The Erased Block Count (EBC) field defines the total number of erased blocks in the memory system 10 at the time the EBM sector is written.

The Map Count field of the map block 64 defines the number of erased blocks identified in each Map sector. The Map Index field includes an index to the addresses of all valid Map sectors in the Map block 64. In this arrangement the current MAP Index is written with each EBM sector. The Map Exchange Source Pointer (MSP) is a pointer to a Map sector to be used as the source sector in the next Map Exchange operation.

The Map Exchange Destination Pointer (MDP) field is a pointer to a Map sector to be used as the destination sector in the next Map Exchange operation.

Each Current Obsolete Blocks (COB), data structure (DC)B1, DCOB2, SCOB1, SCOB2) in the COB field of the Map Block defines the address of one of four blocks which are permitted to contain obsolete Data Sectors, together with a bitmap for the Map block identifying the obsolete sectors within it. A maximum of two blocks may contain obsolete sectors created by write operations at the DWP 46, and two by write operations at the SWP 48. Obsolete sectors are never created by write operations at relocation pointers. The COB data structures in the EBM sector are a copy of the COBs in SRAM 30.

The Write Pointers field of the Map Block EBM sector includes the physical addresses corresponding to each of the DWP, DRP, SWP, and SRP write pointers immediately after the last record termination for that write pointer. The Write Pointer field also includes the block links for each write pointer DWP, DRP, SWP and SRP since its last record termination. This information is necessary to allow the DWSL, SWSL, ABL, CB1 and COB data structures to be reconstructed in SRAM 30 during the initialization of memory system 10.

The last TSAT field defines the full physical address of the last written TSAT sector.

The SATA Address field defines the address of the SATA block within the memory 20.

The Sector Address Table Address Index (SATAI) field is an index to the addresses of all valid SATA sectors in the SATA block.

The SAT address (SATA) Block 66 includes SATA sectors which define the addresses of all SAT blocks within memory 20.

The SATA Sector 66a includes the physical addresses of the blocks of memory 20 containing the SAT 52. On a high capacity device, there may be more than one valid SATA sector 66a, each relating to a logically contiguous range of SAT blocks 62. The range is indicated in the SATA sector header. Only the last occurrence of a SATA sector for a given range is valid.

The Map Address (MA) Block 68 includes map address sectors with the MA Sector containing the address of each of the Map blocks 64. The Bad Block List (BBL) Block 79 includes BBL sectors 70a wherein the Bad Block List (BBL)

Sector 70a is a bitmap of all virtual blocks in Flash memory 20, identifying any which contain defective locations and which are therefore unusable. This information is used only by an external formatter program when the device is being reformatted. The BBL is updated if a block failure occurs during the operating life of the system 10.

The Boot Block (BB) 72 is a special block containing a unique identification code in the header of its first sector, which is located within the memory 20 by the controller 16 by a scanning process during the initialization of the system 10. The Boot Block 72 includes necessary information about the system configuration, and pointers to the Map Address block 68 within Flash memory 20, to allow system initialization. It also includes information which is returned to a host device 12 in response to interrogation within the host interface protocols. Information is contained in different sector types in the Boot Block 72, wherein only the last occurrence of a specific sector type is valid. Two identical copies of the Boot Block 72 are set up for security, close to the top of physical block address space, however only one of the copies is updated with revised Map Address pointers.

The Boot Block Parameters (BBP) Sector 72b of the Boot Block 72 is a list of fixed parameters defining the device configuration.

The Information Structure Sector of the Boot Block 72 includes information which is loaded to a volatile memory, within the controller 16, for access by a host system 12. This may be the Card Information Structure (CIS) within PC Card or CompactFlash protocols.

The Identification Sector of the Boot Block 72 includes information which is returned to host system 12 in response to command requesting identification information. This command may be the Identify Drive command within the ATA protocol.

The MA Address (MAA) Sector 72a of the Boot Block 72 includes the physical address of the MA block 68 which are generally located during the device initialization and boot process. If the MA block 68 is relocated, a new copy of the MAA sector 72a is written.

The Firmware Block 67 includes Firmware sectors with each Firmware sector containing a firmware code page. Multiple Firmware blocks may exist at the lowest non defective virtual block addresses in Flash memory 20.

The processor 24 of the controller 16 is equipped with a volatile RAM and in Table 2, FIG. 19 there is shown the data structures which exist within the processor's volatile RAM.

The Data Write Sector List (DWSL) and Data Relocation Sector List (DRSL) are lists of sectors which have been written at the DWP and DRP write pointers which allow the virtual address to be calculated for any sector contained within them. The DWSL and DRSL can be reconstructed from the data structures in Flash memory 20 during system initialization. Each of the DWSL and the DRSL comprises a single record and these are records of logically contiguous data sectors which have been written. Each record includes the following fields:

LBA: Logical address of the first sector in the record;
Record Length: Length of the record in sectors;
Sector address: Virtual address of the first sector in the record;
Block Address: List of virtual block addresses which store the sectors of the record.

As each sector within a record is written, the Record Length field is incremented by one and as an associated write pointer moves to a new allocated block, the block address is added to the Block Addresses field. A DWSL or DRSL is terminated upon any of the following conditions.

A sector to be written is logically non-contiguous with the previous sector written at the same write pointer.

The logical address of a sector to be written is such that SAT entries for sectors in the record would be contained in more than 4 SAT sectors. This ensures that, for long sequences of contiguous sector writes, the last sector of a record corresponds to the last entry in a SAT page. This minimizes the number of TSAT sector write operations.

The logical address of a sector to be written corresponds to a different SAT block from the other sectors in the record. This ensures that only a single SAT block write can be required during a control write operation.

The logical address of a sector to be added to the DWSL record is already present in the DRSL record, or vice versa.

The DWSL and DRSL records are normally terminated together, and termination of records triggers a control write operation, which operates on sectors in both records after which the DWSL and DRSL records are then cleare.

The System Write Sector List (SWSL) and System Relocation Sector Lit (SRSL) are lists of sectors which have been written at the SWP and SRP writer pointers which allow the virtual address of what to be calculated for any sector contained within them. The DWSL and the SRSL can be reconstructed from the data structures in Flash memory 20 during system initialization. Each of the SWSL and SRSL comprises a series of records, typically 4, associated with the appropriate write pointer, and each of these records is a record of logically contiguous data sectors which have been written and they have the same format as records for DWSL and DRSL. Each record includes the following fields.

LBA: Logical address of the first sector in the record;
Record Length: Length of the record in sectors;
Sector Address: Virtual address of the first sector in the record.
Block Addresses: List of virtual block addresses which store the sectors of the record.

As each sector within the record is written, the Record Length field is incremented by one.

An SWSL or SRSL record is frozen and a new one created upon the following condition. A sector to be written is logically non-contiguous with the previous sector written at the same write pointer.

The logical address of a sector to be added to the SWSL record is already present in the SRSL record, or vice versa.

When the maximum number of SWSL or SRSL records is exceeded, a control write operation is triggered. A control write operation acts concurrently on all records in the SWSL and SRSL after which the terminated records are then cleared.

Each COB data structure (DCOB1, DCOB2, SCOB1, SCOB2) defines the address of one of four blocks which are permitted to contain obsolete Date Sectors, together with a bitmap for the block identifying the obsolete sectors within it. A maximum of two blocks may contain obsolete sectors created by write operations at the DWP write pointer, and two by write operations at the SWP write pointer. Obsolete sectors are never created by write operations at relocation pointers. The COB data structures in SRAM 30 are copied to the EBM sector whenever the EBM sector is written.

The Write Pointers field includes the virtual addresses corresponding to each of the DWP, DRP, SWP, and SRP write pointers.

The Allocation Block List (ABL) is a list of addresses of erased blocks currently available for assignment to a write pointer, or for rewriting a control structure. The ABL does not contain a record of all erased blocks in the device. In this system, for example, the ABL may have capacity for up to sixteen blocks. The sequence of allocation of blocks from the ABL corresponds to their order within the ABL. The ABL can be reconstructed from the data structures in Flash memory 20 during system initialization.

The Cleared Block List (CBL) is a list of addresses of erased blocks which have been created by a block erasure operation during recent device operation. The CBL may have capacity for up to 16 blocks. The order of blocks within the CBL corresponds to the order in which they were erased. The block erasure rate and rate of inclusion in the CBL need not match the block allocation rate from the ABL. The CBL can be reconstructed from the data structures in Flash memory 20 during system initialization.

The SAT Cache of the processor RAM is a temporary record of the next group of entries in the SAT following the last entry for a data sector which was read from a SAT sector or a TSAT sector in Flash memory. It may contain, for example, 16 entries. Its purpose is to reduce the requirements for Flash memory access during the address translation operation. The SAT Cache is not filled when an entry for a system sector is read from a TSAT or SAT sector.

Data structure locations in Flash memory 20 are defined by entries and fields within other data structures and a schematic representation of these are shown in the reference tree of FIG. 6 which illustrates the data blocks corresponding to those detailed with reference to Table 1.

The Boot Block 72 can be identified during system initialization by a process of scanning for its unique signature in the header of its first sector MAA sector 72a.

Figure 7:
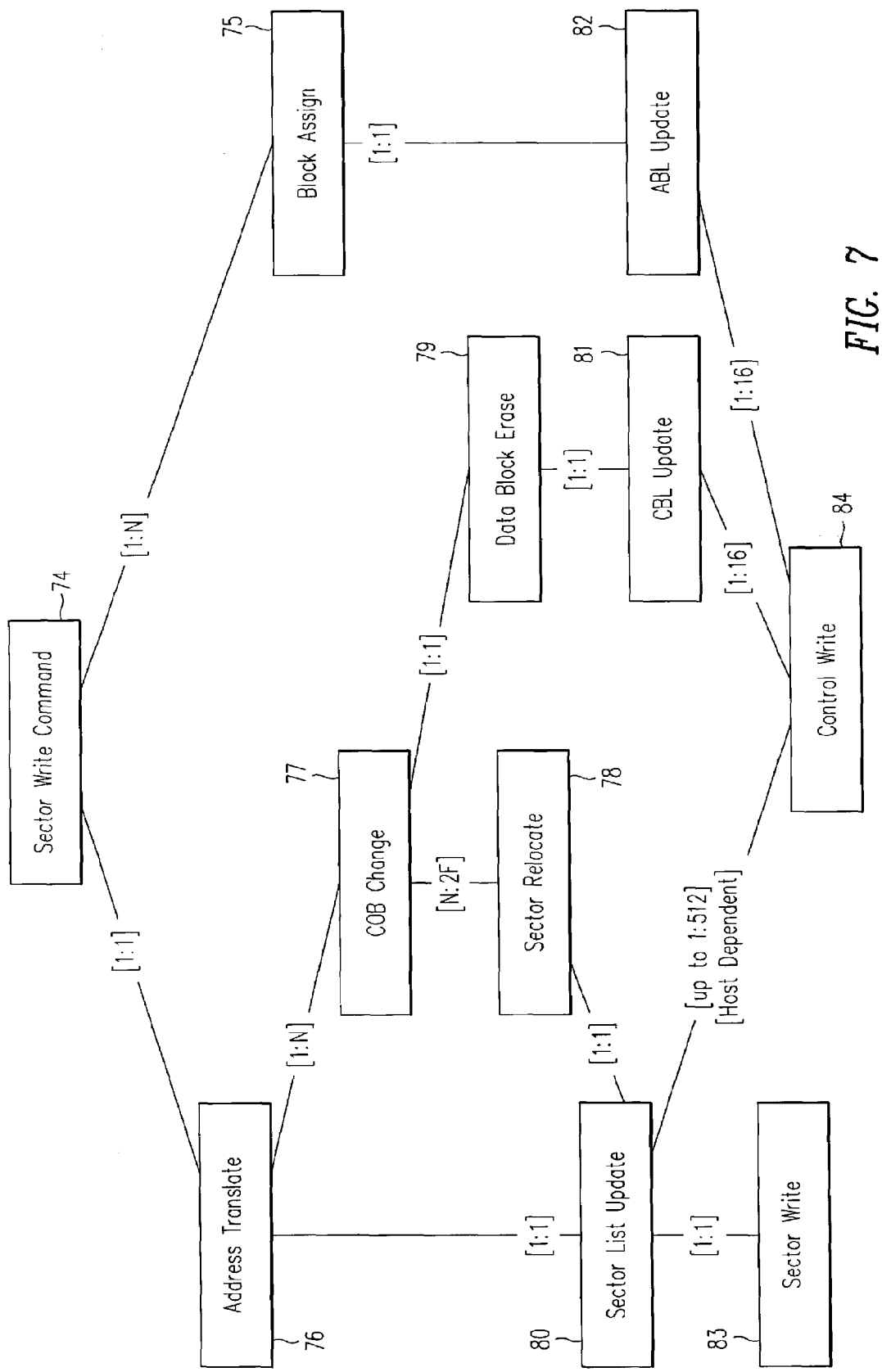
FIG. 7 illustrates a schematic representation of the control operations of the memory system in accordance with an embodiment of the present invention.

The control operations which allow the cyclic storage of data to be performed will now be described. With reference to FIG. 7 there is shown the flow of operations which result from a sector write command, and their relative frequencies of occurrence where N is the Flash physical blocksize, in sectors and F is the size of a file being written, in sectors.

No writing of control data structures to Flash memory 20 is required within this sequence, which is a significant factor contributing to high data write performance. When control structures in Flash memory 20 have to be modified, a control write operation is performed.

The Address Translate operation 76 implements a logical to physical address translation and is performed before every sector write operation to establish the existing physical location of the logical sector which is about to be written, or to locate the sector for a read operation. In all cases where a valid version of the sector exists in Flash memory 20, the target logical address may optionally be verified in the header of the sector by a sector read operation. Address translation is separately described in full.

The Block Assign operation occurs when a sector write operation causes one of the write pointers to jump to a new block, or a new block is made available for a control structure. The operation 78 allows the new block to be assigned by using the top entry on the Allocation Block List (ABL).

Only two blocks with obsolete sector data are permitted to be associated with each of the DWP and SWP write pointers. When a data sector is to be written which would create obsolete data in a third block, a COB change operation 77 is performed to assign this third block as one of the two permitted COB blocks, and to perform a block erase operation on the one of the two current COB blocks. The COB block selected to be changed is generally the block with the lesser number of valid sector which need be relocated, but may also be the older of the two COB blocks. If the selected COB block includes a write pointer, the other COB block is alternatively selected for the block erase operation. The appropriate COB data structure in processor RAM is updated.

A data block erase operation 79 causes a single block in physical memory of the Flash memory 20 to be erased. COB data structures in processor RAM are used to determine if the block includes any valid data sectors which are first relocated. Sectors are relocated by writing them at the DRP or SRP pointers, as appropriate.

When an obsolete block is to be erased as a result of a COB change operation 78, a sector relocate operation is performed if the block includes any valid sectors. Valid sectors are read from the obsolete block, and written at the appropriate DRP and SRP write pointer address, before the obsolete block is erased.

When the Sector List Update operation 80 is performed, a record in either the DWSL, SWSL, DRSL, or SRSL, as appropriate, is modified or created to record the sector which is being written or relocated. If the maximum number of records in the sector list is exceeded, a control write operation 84 is triggered.

During the ABL Update operation 82, the Abl is modified to remove the address of an erased block which has been allocated for use. If the ABL becomes empty, a control write operation 84 is triggered.

During CBL Update operation 81, the CBL is modified to add the address of a block which has been erased during operation of the device. If the CBL becomes full, a control write operation 84 is triggered.

Figure 8:
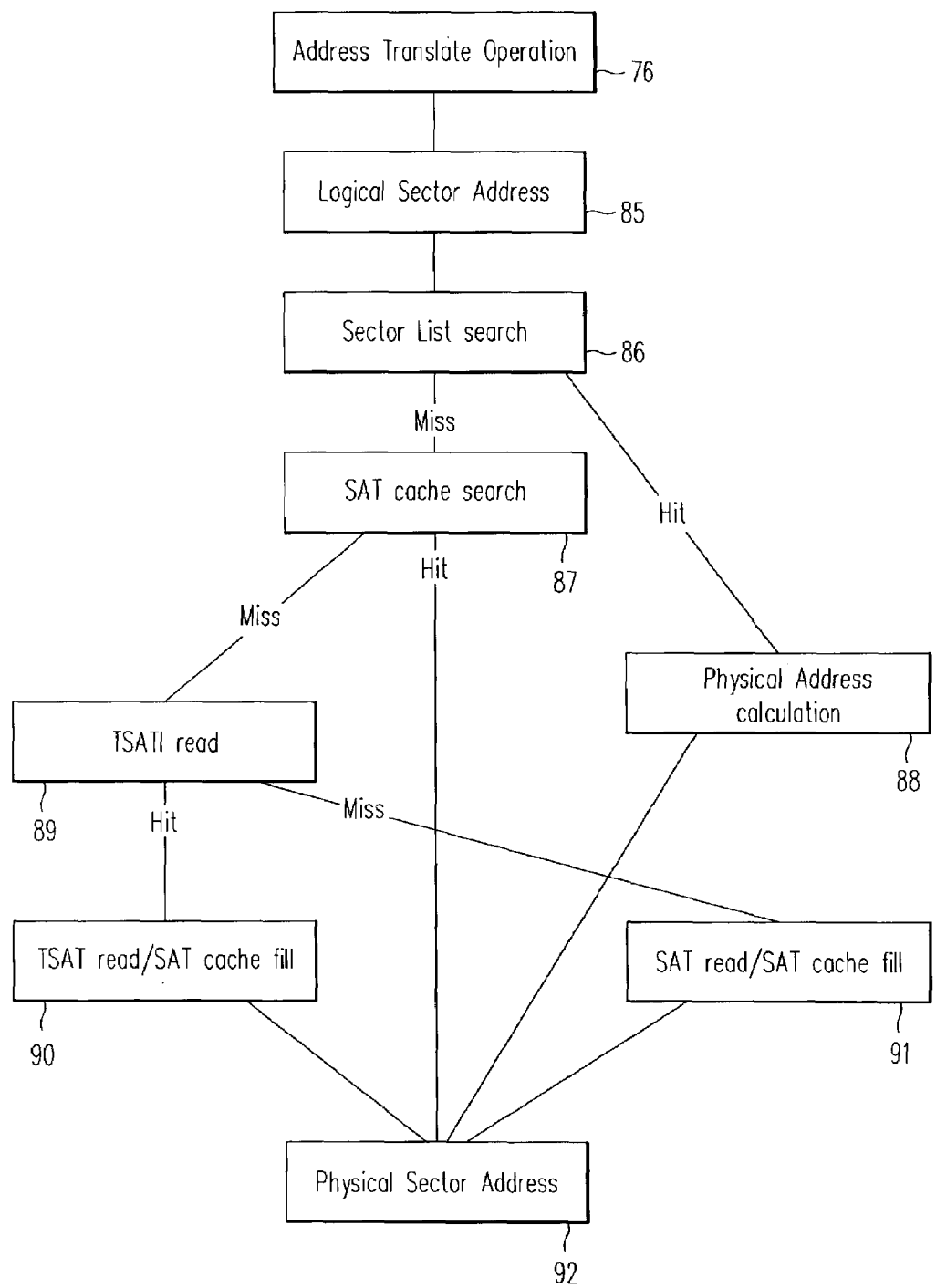
FIG. 8 depicts a schematic representation of the flow of operations of the address translation operation of an embodiment of the present invention.

In FIG. 8 there is shown, in more detail, the address translation operation 76 in more detail and in particular the flow of operations which take place to perform the sector address translation function.

The characteristics of individual operations performed during the address translation operation 76 will now be described in more detail.

A sector is identified as relating either to user data or system data, and a Write Sector List (WSL) search 86 is made of records in either the DWSl and DRSL, or SWSL and SRSL, as appropriate. A record search requires a check to be made for the target address lying within the address range for the record determined by the record start address and the record length.

A SAT cache search operation 87 is performed only for data sectors. It requires a check to be made for the target address lying within the address range for the SAT cache determined by the cache start address and the cache length of 16 sectors. For operations on a logically contiguous file, 15 out of 16 sectors will result in a SAT cache hit. When a miss occurs, the cache is refilled with the following 16 sector addresses when the TSAT or SAT page is subsequently read.

A TSATI read operation 89 requires the TSATI field to be read from the most recently written TSAT sector in the target SAT block, and a search made in its index entries for the target SAT sector address. A TSATI read and search may only be necessary after a SAT cache search 87 miss, which is for 1 in 16 sectors for a sequential file. However, the processor keeps in processor RAM the logical address of the alst SAT sector 62c accessed, and the physical location of the corresponding TSAT sector 62a or SAT sector 62c, and if this corresponds with the target SAT sector, a TSATI search is unnecessary. Therefore, a TSATI read is required only once per 128 sectors for a sequential file, since a SAT sector has addresses for 128 data sectors.

The SAT read/SAT cache fill operation 91 and TSAT read/SAT cache fill operation 90 are identical, and require a SAT sector 62c or TSAT sector 62a or 62b to be read, and sixteen SAT entries to be loaded into the SAT cache in processor RAM. The processor keeps within the processor RAM, the address of the last accessed SAT block. Therefore, it is only necessary to read a SATA sector 66*a* or an EBM sector 64*a* to determine the physical address of a SAT block 62 when the SAT block 62 has changed from the one used during the previous address translation operation.

The physical address calculation 88 is performed when a target sector address is identified as lying within a sector list record and the calculation 92 allows, its position relative to the start logical address to be determined and its virtual address calculated from the sector address and block address fields of the record.

The Typical operations flows for address translation for Data sectors which are logically sequential are as follows:

15 in each 16 sectors for the Sector list search operation 86 followed by the SAT cache search operation 87;

1 in each 16 sectors for the Sector list search operation 86, followed by the SAT cache search operation 87 and the TSAT or SAT read/SAT cache fill operation 90 or 91.

1 in each 128 sectors for the Sector list search operation 86 followed by the SAT cache search operation 87, the TSATI read operation 89 and the TSAT or SAT read/SAT cache fill operation 90/91.

The operation flows for address translation for System sectors in a typical case is the Sector list search operation 86 followed by the Physical address calculation operation 88 upon identification of a target sector address within a sector list record.

However, in a worst case scenario the flow is Sector list search operation 86 followed by TSATI read operation 89 and TSAT or SAT read/SAT cache fill operation 90/91.

Figure 9:
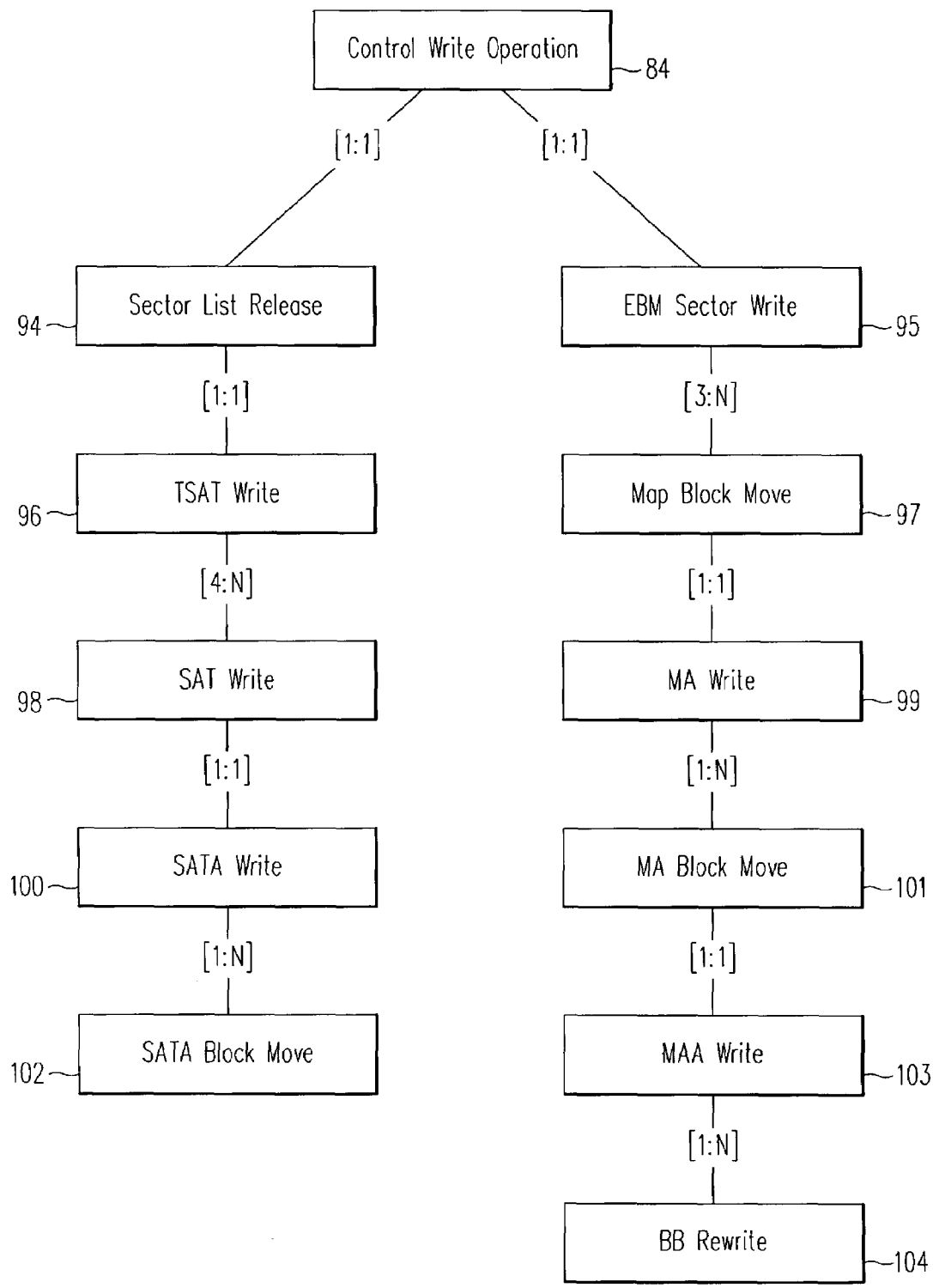
FIG. 9 shows a schematic representation of the control write operation of the memory system in accordance with an embodiment of the present invention.

The Control Write Operation 84 implements a control write operation which updates control data structures in Flash memory 20. The flow of operations involved in the control write operation 84 is illustrated in FIG. 9.

Each of the operations which make up a control write have two components. The first component relates to data structures which enable logical to physical address mapping for data sectors supplied by a host system 12, and the second component relates to data structures which manage erased blocks within the Flash memory 20 and their scheduling for use in writing data or control structures.

The sector list release operation 94 is performed on the DWSL and DRSL together, or the SWSL and SRSL together, if the current control write operation was triggered by termination of a record in a sector list. If the control write operation was triggered by a CBL or ABL update operation, all sector lists are terminated. A sector list release causes all required information relating to sectors and blocks contained within the list to be transferred to data structures in Flash memory 20, and the sector list data structure in the processor's volatile RAM to be cleared.

The TSAT write operation 96 is performed during a sector list release to store in Flash memory 20 the virtual addresses for sectors within the records in the DWSL and DRSL or within records in the SWSL and SRSL. When a TSAT sector 62*a* or 62*b* is written, it is located at the first available sector position in the TSAT partition of the SAT block to which the sector relates. If the TSAT partition is full, a SAT block write operation is performed.

The SAT write operation 98 requires one or more sectors of a single SAT block 62 to be modified to incorporate new entries for all sectors referenced by valid TSAT sectors 62*c* within the SAT block 62. It is performed when the TSAT partition within a SAT block becomes filled. All sectors of the SAT block are rewritten with or without modification to a newly assigned SAT block. The previous location of the SAT block is erased and a modified SATA sector written.

The SATA write operation 100 requires an updated SATA sector 66*a* to be written to record a changed address for a SAT block 62. The EBM sector 64*a* is written with updated SATA Index information.

When a SATA sector 66*a* is written and no erased sector exists in the SATA block 66, a block assign operation is performed and the SATA sector written to its first sector by SATA block more operation 102. The EBM sector 64*a* is written with updated SATA Address and SATA Index information. The previous location of the SATA Block 66 is erased, and its address added to the CBL.

The EBM sector write operation 95 updates erased block management data structures in Flash memory 20 and the ABL and CBL in processor RAM.

When the Map block 64 is filled, all valid Map sectors as identified in the Map index in the EBM sector are rewritten to a new assigned block, together with an EBM sector by Map Block Move operation 97. The previous location of the Map block 64 is erased and a modified MA sector 68*a* written.

The MA Write operation 99 ensures this modified MA sector 68*a* is written when the new Map block is written.

When an MA sector 68*a* is written and no erased sector exists in the MA block 64, a block assign operation is performed and the MA sector 68*a* written to the first sector 64*b* of MA block 64 by MA block move operation 101. The previous location of the MA block 64 is erased, and its address added to the MAA sector 72*a* in the boot block 72.

When the address of MA block 68 changes as a result of an MA block move operation 101, an updated MAA sector 72*a* is written to the boot block 72 by MAA write operation 103.

When an MAA sector is written and no erased sector exists in the boot block 72, a boot block rewrite operation 104 is performed. A second copy of the boot block exists and includes only the BBP, Information Structure and Identification sectors. The current MAA sector 72*a* is written to this second boot block copy, and the first boot block copy is erased. The BBP, Information Structure and Identification sectors are then written back from the second copy to the first copy. The second copy then becomes the active copy, and the first copy is held as a security copy. Subsequent MAA sectors are only written to the second copy.

The EBM Sector Write Operation 95 will now be described in more detail with reference to FIG. 10 which shows the flow of operations required to perform the EBM sector write function.

Figure 10:
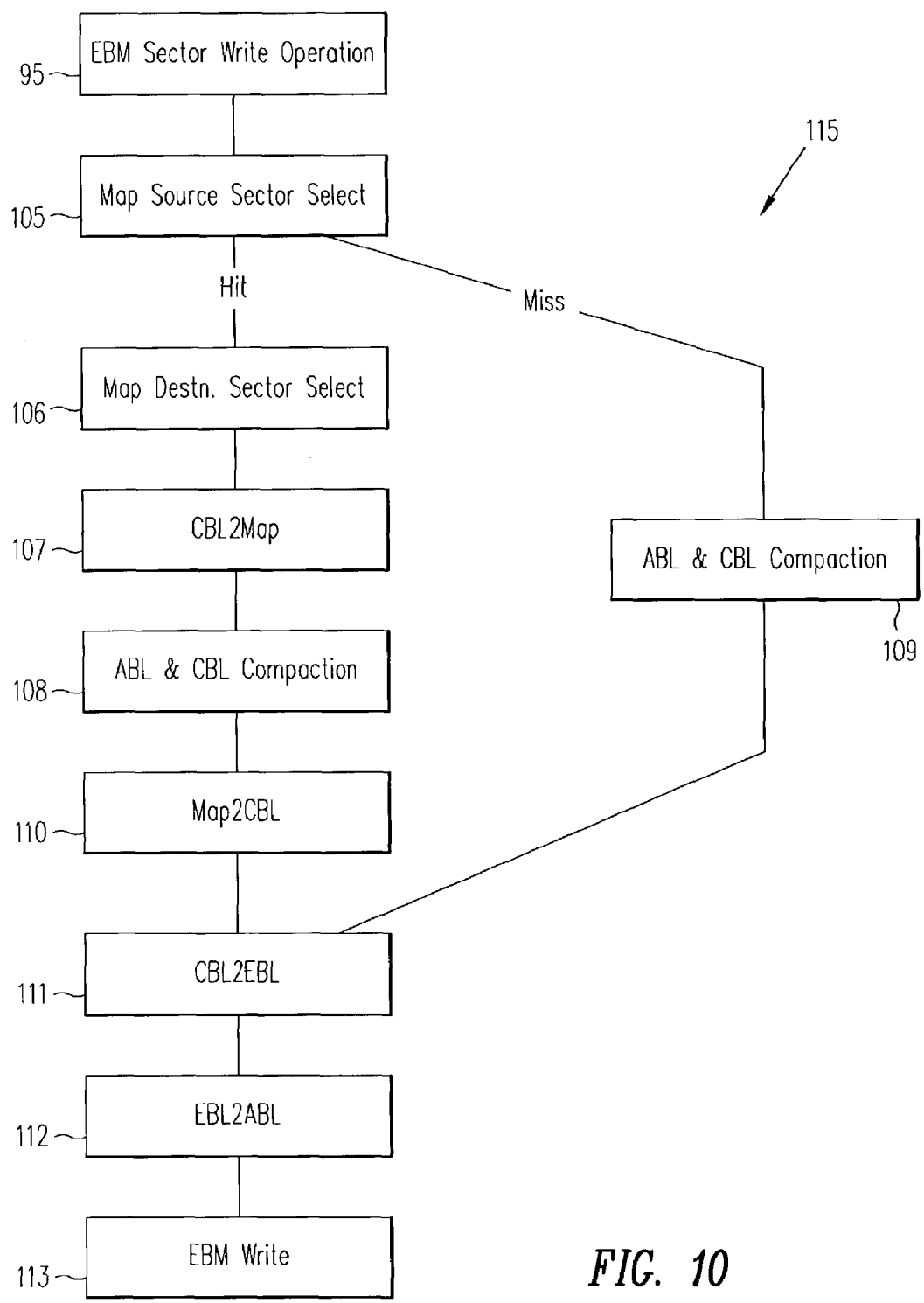
FIG. 10 illustrates a schematic representation of the EBM sector write function operation of the memory system in accordance with an embodiment of the present invention.

The flow diagram shown in FIG. 10 defines the block sequencing algorithm 115 for erased block allocation for use in writing data or control structures. If the memory system 10 is not full, that is there are erased blocks marked in bitmaps in one or more Map sectors 64*b*, the block addresses added to the end of the Erased Block List data structure, which solely defines blocks for allocation and use, relate to a combination of blocks from Map sectors and blocks from the CBL which have recently been erased. If the memory system is full, that is there are no erased blocks marked in Map sectors, the block addresses added to the end of the Erased Block List only relate to blocks from the EBL which have recently been erased. In this case, erased blocks are reused in exactly the order they became erased.

Figure 11:
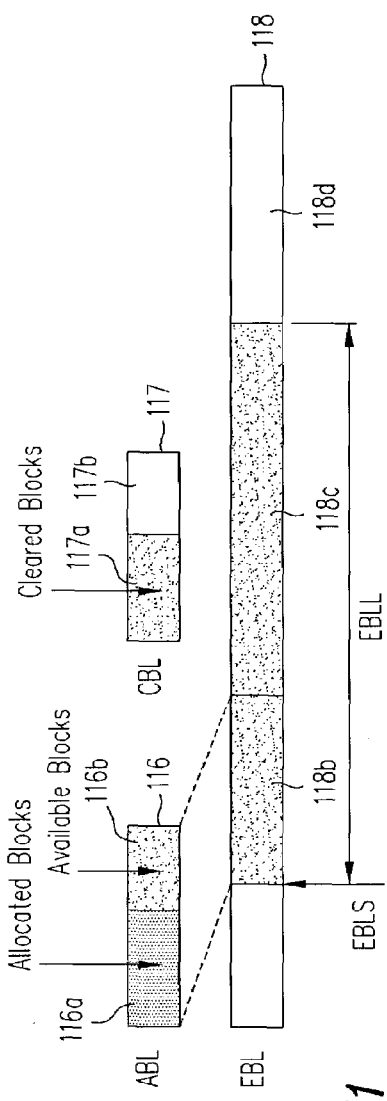
FIG. 11 depicts a schematic representation of the state of the data structures at the start of a map write operation.

Prior to a Map write operation, the EBL is defined in the EBM sector 64*a* by the EBLS and EBLL pointers. The first 16 entries in the EBL are addresses of blocks contained in the ABL in SRAM 30 immediately after the previous Map write operation. Addresses in the ABL in SRAM 30 may relate to blocks which have been allocated for use since the previous Map write operation, or to erased blocks which are available for allocation. The ABL and CBL may both be full, partially filled, or empty at the start of a Map write operation. A schematic representation of this operation is shown in FIG. 11.

The Map Source Sector Select operation 105 selects a source sector in the Map for reading erased block addresses by searching forward from the position of the MSP pointer as it was at the completion of the previous Map write operation. The MSP behaves as a cyclic pointer advancing through physical address space. If no erased blocks are indicated in any Map sector, as determined from the Map Count parameter, exchange operations with Map sectors are omitted.

The Map Destination Sector Select operation 106 finds a destination sector in the Map for writing erased block addresses by inspecting the block addresses in the CBL. Only one destination sector is selected.

Figure 12:
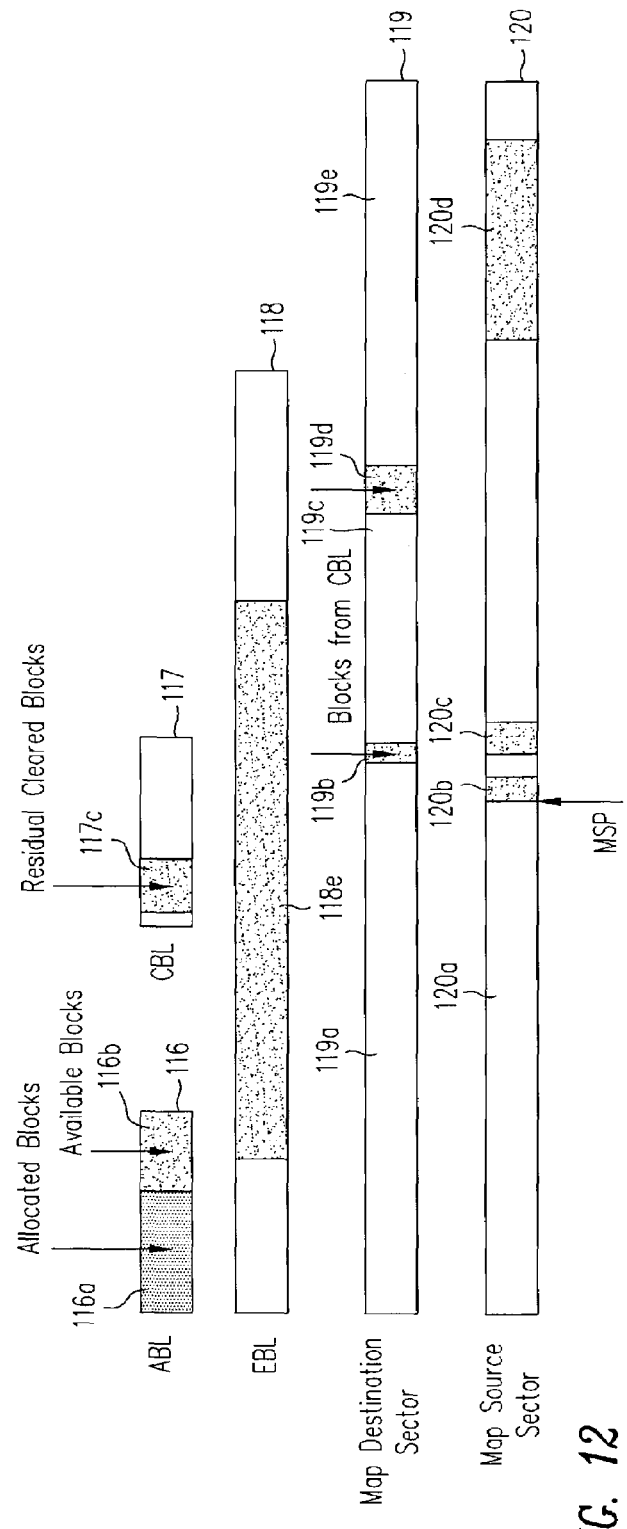
FIG. 12 shows a schematic representation of the state of the data structures following the CBL map operation.

The CBL2Map operation 107 ensures any block addresses in the CBL which relate to the selected Map destination sector are removed, and the corresponding bits in the Map destination sector are set to the erased state. The Map sector is rewritten to Flash, unless the same sector is also the Map source sector. The CBL need not be emptied by this operation 107, and may contain residual cleared blocks which could not be written to the Map destination sector. The state of the data structures following this operation is shown in FIG. 12.

The ABL and CBL Compaction 108 ensures the CBL is compacted by shifting the entries for residual cleared blocks to the beginning of the CBL and that the Abl is compacted by removing entries for allocated blocks which are associated with the sector list release being performed during the same control write operation, and shifting remaining entries to the beginning of the ABL. The state of the data structures following this operation is shown in FIG. 13.

The Map2CBL operation 110 ensures block addresses corresponding to bits in the Map source sector between the MSP pointer and the end of the sector, which are in the erased state, are written to the CBL and the bits in the Map source sector are changed to the unerased state. During this operation as many blocks as possible are written, filling the CBL if possible with the CBL being used as a write buffer in this operation. The Map sector is rewritten to Flash memory 20 and the MSP pointer is changed to point to the last block written in the CBL. The state of the data structures following this operation is shown in FIG. 14.

Figure 15:
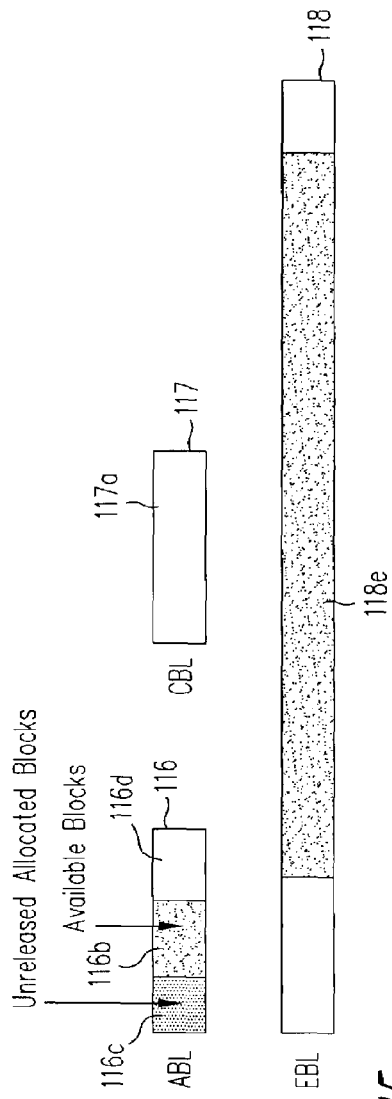
FIG. 15 shows a schematic representation of the state of the data structures following the CBL to EBL operation.

The CBL2EBL operation 111 ensures the block addresses buffered in the CBL 117 are added to the end of the EBL, and the CBL is cleared. The blocks added to the EBL are a combination of recycled blocks from the CBL which are residual blocks remaining after the CBL2Map operation, and blocks defined by the cyclic MSP pointer which were loaded during the Map2CBL operation 110. The state of the data structures following this operation are shown in FIG. 15.

Figure 16:
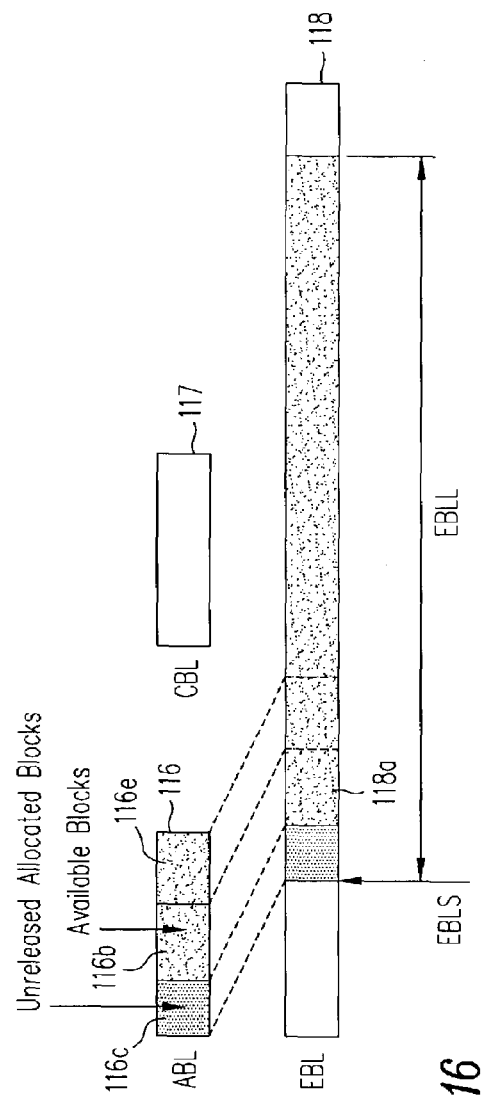
FIG. 16 illustrates a schematic representation of the state of the data structures following the EBL to ABL operation.

The EBL2ABL operation 112 ensures the ABL is filled by writing as many block addresses as required from the head of the EBL 118, or from positions 118a in the EBL 118 immediately following any available blocks already in the ABL 116. The addresses of unreleased allocated blocks at the head of the ABL are copied to the head of the EBL. The EBLS pointer is updated to make the first block addresses in the ABL and EBL correspond, and the EBLL is modified. The state of the data structures following this operation is shown in FIG. 16.

The EBM Write 113 ensures all required fields in the EBM sector which is buffered in the controller 16 are updated, and the sector is written to the Map block 64.

Cyclic Storage operation achieves its high performance in part by exploiting the unique traceable characteristics of the data structures stored in Flash memory 20 to allow volatile SRAM 30 within the controller 16 to be used for short-term storage of control data structures. This can be done without risk of loss of information when the controller is powered down.

A vital step in the initialization of the system 10 after it is powered up by a host 12 is the reconstruction of the data structures in SRAM 30 from those in Flash memory 20. All control data structures in Flash memory is found, then the recently written host data structures are scanned to reconstruct the SRAM 30 data structures.

Figure 6:
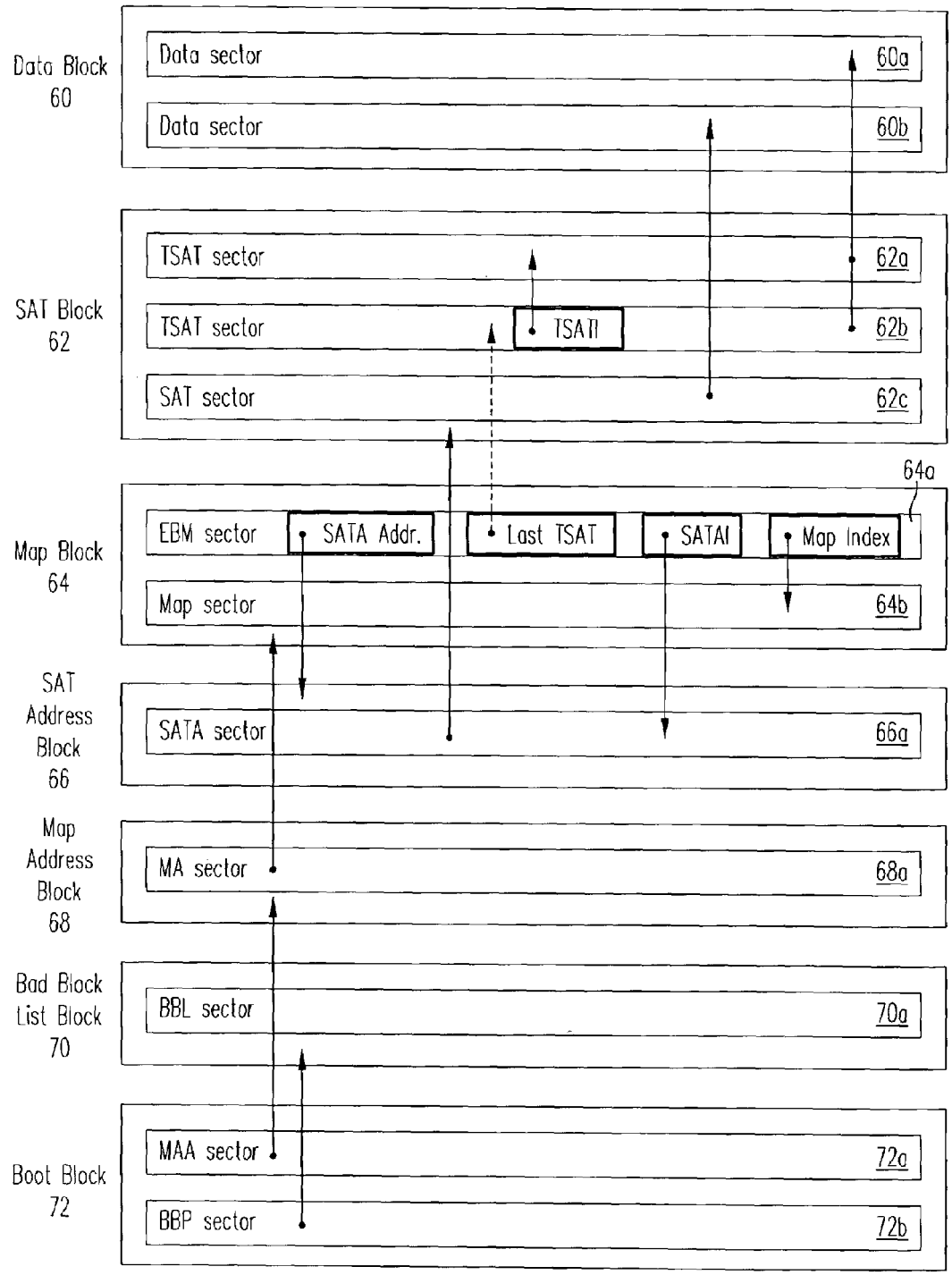
FIG. 6 shows a schematic representation of the data structures in the memory system of an embodiment of the present invention.

The data structures in Flash memory 20 are reconstructed by the following process, which makes use of the reference tree for data structures shown in FIG. 6.

The boot block 72 is found by scanning sectors from the lowest physical address in Flash memory 20. The BBP sector 72b is always the first sector of the boot block 72 and includes a uniquely identifiable signature in its header which allows it to be identified. Only sectors which can be the first sector of blocks with the smallest supported blocksize need be read. Blocks at the lowest addresses in Flash memory 20 which may be defined as always storing firmware code need not be scanned. The scanning process to identify the boot block is very short, as the boot block is located at the first available block at the beginning of Flash memory, following any blocks for firmware storage.

The BBP sector 72b and valid MAA sector 72a within the boot block 72 are found, read and verified.

The second copy of the boot block is found and verified, at the address defined in the BBP sector 72b.

The Map Address block 68 is found, as defined in the MAA sector 72a, and its valid MA sector 68a found and verified.

The Map block 64 is found and verified, as defined in the MA sector 68a.

The valid EBM sector 64a within the Map block 64 is found and verified.

The ABL, rite pointers, sector lists and COBs are initialized, according to fields in the EBM sector 64a.

The SATA block 66 and valid SATA sector 66a are found and verified, as defined in the EBM sector 64a.

The data structures in volatile RAM are then reconstructed by the following process. The first 16 entries of the EBL in the EBM sector 64a are read to establish the ABL contents after the immediately preceding control write operation.

The Write Pointers field in the EBL sector 64a is read. This defines the location of the DWP, DRP, SWP and SRP pointers immediately after the last control write operation in which sector list records were terminated, and also defines the order of blocks, if any, written by each pointer between that control write operation and the immediately preceding control write operation.

Sectors are read from any such identified blocks, to establish a chain of linked logical sectors at the DWP. This information is used to build the DWSL record.

The first sectors in blocks in the reconstructed ABL are read in sequence, to identify blocks associated with the DWP from sector headers contained in the blocks. When such a block is identified, all its sectors are read, and building of the DWSL record, as in step 3, is completed. Blocks associated with the DWP, identified in step 4, are marked as allocated within the ABL, to construct the current version of the ABL as it existed prior to the previous power-down.

These steps are repeated for the DRP, SWP, and SRP, to reconstruct the DRSL, SWSL and SRSL. This also completes the reconstruction of the ABL.

The DCOB1, DCOB2, SCOB1 and SCOB2 date structures as they existed after the immediately preceding control write are read from the EBM sector.

Address translation is performed in sequence for the sectors in the DWSL, DRSL, SWSL, and SRSL records which have already been reconstructed, to identify the sequence of sectors and blocks which have become obsolete since the immediately preceding control write. This allows the evolution of the COBs to be reconstructed and the CBL to be created. Any obsolete sectors thus identified which appear in SWSL records which have been reconstructed are removed from these records. No obsolete sectors are created by write operations at the DRP and SRP, and records associated with them can be neglected in this step.

These reconstructed versions of the DWSL, DRSL, SWSL, SRSL, ABL, CBL, DCOB1, DCOB2, SCOB1, and SCOB2 are used for subsequent device operations.

A set of power loss recovery functions can be employed to repair data structures if they are either corrupted or do not correspond to each other as a result of power loss during normal operation.

These functions make use of the same characteristics or traceability within Cyclic Storage media management operation that allow the reconstruction of the data structures in volatile RAM during initialization as has been described.

Various modifications may be made to the arrangement as hereinbefore described without departing from the scope of the invention. For example, a system which incorporates a flash disk device may be physically partitioned in several ways, according to the system architecture, however, all systems generally conform to the structure described herein before. For example, the flash memory 20 is shown in FIG. 1 as being part of a memory system 10, however, it may alternatively be on a removable card and may connect to a host system via a logical interface 14 which as before conforms to industry standard protocols. Examples of such industry standards being PCMCIA ATA, CompactFlash and MultiMediaCard. In such an arrangement the controller may be on a removable card in which case the controller is typically a single integrated circuit. The Flash memory 10 may consist of one or more integrated circuits and the controller may be integrated on the same integrated circuit as the Flash memory.

Figure 17:
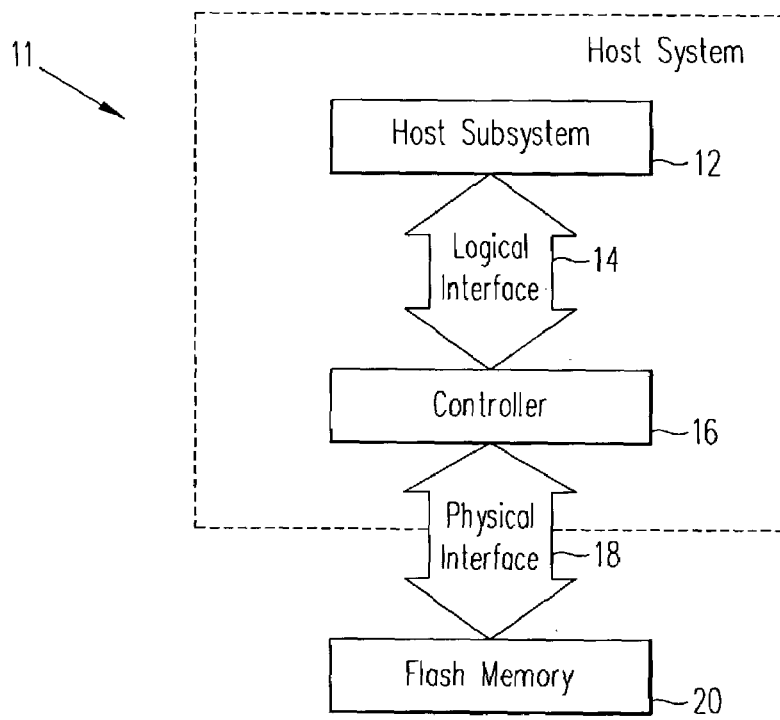
FIG. 17 illustrates a schematic representation of an alternative host system and flash system in which an embodiment of the present invention is implemented.

It could also be the case that the host and the flash system may be physically partitioned such that only the Flash memory is on a removable card, which has a physical interface to the host system. A hierarchy of this arrangement is shown in FIG. 17. A example of such a removable Flash memory card is SmartMedia. The controller is located within the host system 11 and may take the form of an integrated circuit, or of firmware which is executed by a processor within the host system.

Alternatively the method of the present invention may be implemented in an embedded memory system which is not physically removable from a host system. Such a system may have the same partitioning as is used for a memory system on a removable card, with the controller being in the form of an integrated circuit and with a logical interface conforming to industry standard protocols. However, the controller may also be integrated with other functions within the host system.

In the arrangement described, each sector is identified by a LBA, however it may also be identified by an address in the Cylinder/Head/Sector (CHS) format originally used with magnetic disk devices. Also in the described arrangement the controller hardware is dedicated architecture in a separate integrated circuit, however, elements of the controller hardware, such as the microprocessor, may be shared with other functions within the host system. Additionally the cyclic storage management algorithm may be implemented in a microprocessor within the host system or the process may be performed via a standard microprocessor input/output ports without any dedicated controller hardware. If the controller is part of an embedded memory system and shares its microprocessor with other functions of a host system, the logical interface for the control of the memory system may be implemented directly within firmware executed by the processor. This means that hardware registers may be eliminated and variables may be passed directly to a controller function which may be called by a host function within the firmware code.

In the flash memory system described previously, data transfer between the host or flash interfaces and the SRAM are performed by DMA, however in an alternative embodiment a separate memory block could be used exclusively for buffering sector data. Typically this memory block could be a dual port RAM, with ports allocating independent access by the host interface control block and the flash interface control block.

In the described arrangement the memory blocks into which the memory sectors were arranged were described as being a physical structure within the flash memory comprising 32 sector locations, however it is also possible that these memory blocks comprise 16 Sector locations. Also the memory blocks can alternatively be virtual blocks comprising physical blocks distributed across multiple flash chips or multiple independent arrays within the same chip which are erased in a single operation by the controller. Where a virtual block comprises M physical blocks, each with capacity for N sectors, the virtual block has capacity for M*N sectors. A virtual block is treated in exactly the same way as a physical block by the cyclic storage media management algorithms.

It should also be noted that the ROM and expansion port of the controller are optional features only and need not be included in the controller for performing the cyclic storage management operation.

Although the present invention has been described in terms of specific embodiments it is anticipated that alterations and modifications thereof will no doubt become apparent to those skilled in the art. It is therefore intended that the following claims be interpreted as covering all such alterations and modification as fall within the true spirit and scope of the invention.

TABLE 1

| Block Type | Sector Type | Field |
|---|---|---|
| 60 Data | Data sector | |
| 62 SAT | TSAT sector | TSAT Index |
| | SAT sector | (TSATI) |
| 64 Map | Map sector | MZF |
| | | (in header) |
| | EBM sector | EBL |
| | | EBLS |
| | | EBLL |

TABLE 1-continued

| Block Type | Sector Type | Field |
|---|---|---|
| | | EBC |
| | | Map Count |
| | | Map Index |
| | | MSP |
| | | MDP |
| | | DCOB1 |
| | | DCOB2 |
| | | SCOB1 |
| | | SCOB2 |
| | | Write Pointers |
| | | Last TSAT |
| | | SATA Address |
| | | SATA Index |
| 66 SAT Address (SATA) | SATA sector | |
| 68 Map Address (MA) | MA sector | |
| 70 Bad Block List (BBL) | BBL sector | |
| 72 Boot Block (BB) | BB Parameter (BBP) sector | |
| | Information Structure sector | |
| | Identification sector | |
| | MA Address (MAA) sector | |
| 67 Firmware | Firmware sector | |

TABLE 2

| Data Structure |
|---|
| Data Write Sector List (DWSL) |
| Data Relocation Sector List (DRSL) |
| System Write Sector List (SWSL) |
| System Relocation Sector List (SRSL) |
| Data Current Obsolete Block 1 (DCOB1) |
| Data Current Obsolete Block 2 (DCOB2) |
| System Current Obsolete Block 1 (SCOB1) |
| System Current Obsolete Block 2 (SCOB2) |
| DWP, DRP, SWP, SRP Write Pointers |
| Allocation Block List (ABL) |
| Cleared Block List (CBL) |
| SAT Cache |

What is claimed is:

1. A non-volatile memory system comprising:
volatile memory;
non-volatile memory including control data structures; and
a controller coupled to said non-volatile memory, said controller comprising means for maintaining lists in the volatile memory of blocks in the non-volatile memory allocated for storage of logical sector data, associated with logical addresses, and of blocks recently erased in the non-volatile memory, a plurality of cyclic write pointers for tracking the sequence of sector writing using the logical addresses, said controller further comprising transferring means for transferring information from the lists in the volatile memory to control data structures in the non-volatile memory less frequently than the rate at which the contents of the lists in volatile memory are changed, and means for including with every sector when written in the non-volatile memory a header containing logical address information representative of its logical address and further comprising means for reconstructing the lists in the volatile memory from existing information within the non-volatile memory wherein said existing information includes the logical address information in the headers of recently written sectors, the cyclic write pointers used to track the sequence of sector writing using logical addresses in the header of sectors in sequential physical position, the memory system including means for maintaining a Sector Address Table (SAT) of a list of physical sectors addressing the sectors in non-volatile memory corresponding to all sectors in the memory system, the SAT being maintained in a plurality of SAT blocks and having n number of entries, the nth entry including the physical address for the sector having logical address n, each SAT block having two equal partitions, a SAT partition dedicated to SAT entries and a temporary SAT (TSAT) partition, the TSAT partition of the block being an area in which TSAT sectors, which are written during a control write operation, are temporarily stored before being written in the SAT partition, an index of valid TSAT sectors and their position in the TSAT partition being maintained in a TSAT Index (TSATI) field in the most recently written TSAT sector,
wherein when a TSAT sector is written, it is located at the first available sector position in the TSAT partition of the SAT block to which the sector relates, a SAT block is rewritten when its TSAT partition is full with valid TSAT sectors in the previous TSAT partition replacing the corresponding SAT sectors in the SAT partition, and the TSAT partition being left empty.

2. A non-volatile memory system as recited in claim 1 wherein the transferring means is operable to transfer the information from the lists in the volatile memory to the control data structures in the non-volatile memory concurrently with logical to physical mapping information for sectors from other lists in the volatile memory.

3. A non-volatile memory system, as recited in claim 1, wherein the cyclic write pointers comprises a data write pointer for defining the physical location for writing a file including a plurality of sectors.

4. A non-volatile memory system, as recited in claim 1, wherein the cyclic write pointers comprises a system write pointer for defining the physical location for writing system sectors transmitted by a host system.

5. A non-volatile memory system, as recited in claim 1, wherein the cyclic write pointers comprises a data relocation pointer for defining the physical location for writing file data sectors which occasionally are to be relocated prior to a block erasure for recovery of capacity occupied by obsolete file data sectors.

6. A non-volatile memory system, as recited in claim 1, wherein the cyclic write pointers comprises a system relocation pointer for defining define the physical location for writing system sectors which are being relocated prior to a block erasure for recovery of capacity occupied by obsolete system sectors.

7. A non-volatile memory system comprising:
non-volatile memory including blocks, each block having sectors addressed by logical addresses and stored and read from the non-volatile memory using physical addresses identifying sectors in physical locations or positions within the non-volatile memory, the blocks being in the erased states and blocks which have been recently erased; and
a controller coupled to a non-volatile memory and including a volatile memory, wherein the controller maintains a first list of all blocks in the non-volatile memory which are in the erased state and which are not included in other lists, the controller further maintains a second list of blocks in the non-volatile memory which have been recently erased, the lists allocated for storage of logical sector data, associated with logical addresses, and of blocks recently erased in the non-volatile memory, a plurality of cyclic write pointers for tracking the sequence of sector writing using the logical addresses, the cyclic write pointers used to track the sequence of sector writing using logical addresses in the header of sectors in sequential physical position, wherein even use of blocks in the non-volatile memory for storage of data over a long period of operation is achieved and "hotspots" in non-volatile memory usage is avoided thereby increasing reliability of the memory system, the memory system including means for maintaining a Sector Address Table (SAT) of a list of physical sectors addressing the sectors in non-volatile memory corresponding to all sectors in the memory system, the SAT being maintained in a plurality of SAT blocks and having n number of entries, the nth entry including the physical address for the sector having logical address n, each SAT block having two equal partitions, a SAT partition dedicated to SAT entries and a temporary SAT (TSAT) partition, the TSAT partition of the block being an area in which TSAT sectors, which are written during a control write operation, are temporarily stored before being written in the SAT partition, an index of valid TSAT sectors and their position in the TSAT partition being maintained in a TSAT Index (TSATI) field in the most recently written TSAT sector, wherein when a TSAT sector is written, it is located at the first available sector position in the TSAT partition of the SAT block to which the sector relates, a SAT block is rewritten when its TSAT partition is full with valid TSAT sectors in the previous TSAT partition replacing the corresponding SAT sectors in the SAT partition, and the TSAT partition being left empty.

8. A non-volatile memory system as recited in claim 7 wherein the non-volatile memory includes control data structures and information from the lists in the volatile memory is transferred to the control data structures concurrently with logical to physical mapping information for sectors from other lists in volatile memory.

9. A method of operating a non-volatile memory system including a volatile memory and a non-volatile memory including control data structures, the method comprising:

maintaining lists in the volatile memory of blocks in the non-volatile memory allocated for storage of logical sector data and of blocks recently erased in the non-volatile memory;

transferring information from the lists in the volatile memory to control data structures in the non-volatile memory less frequently than the rate at which the contents of the lists in volatile memory are changed;

including with every sector when written in the non-volatile memory, a header containing logical address information representative of its logical address; and reconstructing the lists in the volatile memory during initialization of the system from existing information within the non-volatile memory, wherein said existing information including the logical address information in the headers of recently written sectors;

maintaining a Sector Address Table (SAT) of a list of physical sectors addressing the sectors in non-volatile memory corresponding to all sectors in the memory system, the SAT being maintained in a plurality of SAT blocks and having n number of entries, the nth entry including the physical address for the sector having logical address n, each SAT block having two equal partitions, a SAT partition dedicated to SAT entries and a temporary SAT (TSAT) partition, the TSAT partition of the block being an area in which TSAT sectors, which are written during a control write operation, are temporarily stored before being written in the SAT partition, an index of valid TSAT sectors and their position in the TSAT partition being maintained in a TSAT Index (TSATI) field in the most recently written TSAT sector;

writing a TSAT sector in a location that is at the first available sector position in the TSAT partition of the SAT block to which the sector relates; and rewriting a SAT block when its TSAT partition is full with valid TSAT sectors in the previous TSAT partition replacing the corresponding SAT sectors in the SAT partition, and the TSAT partition being left empty.

10. A method as recited in claim 9, wherein said transferring from the lists to control data structures in the non-volatile memory occurs concurrently with logical to physical mapping information for sectors from other lists in the volatile memory.

* * * * *